United States Patent
Kim et al.

(10) Patent No.: US 11,730,046 B2
(45) Date of Patent: Aug. 15, 2023

(54) DISPLAY DEVICE HAVING REPAIR STRUCTURE

(71) Applicant: LG Display Co., Ltd., Seoul (KR)

(72) Inventors: Dohyung Kim, Paju-si (KR); Joonsuk Lee, Paju-si (KR); Saemleenuri Lee, Paju-si (KR); Dasom Hong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 346 days.

(21) Appl. No.: 17/095,264

(22) Filed: Nov. 11, 2020

(65) Prior Publication Data
US 2021/0143373 A1 May 13, 2021

(30) Foreign Application Priority Data

Nov. 12, 2019 (KR) .................... 10-2019-0144371

(51) Int. Cl.
| | |
|---|---|
| *H10K 59/123* | (2023.01) |
| *H10K 71/00* | (2023.01) |
| *H10K 50/84* | (2023.01) |
| *H10K 50/13* | (2023.01) |
| *H10K 50/828* | (2023.01) |
| *H10K 59/124* | (2023.01) |
| *H10K 59/35* | (2023.01) |

(52) U.S. Cl.
CPC ........... *H10K 71/00* (2023.02); *H10K 50/131* (2023.02); *H10K 50/828* (2023.02); *H10K 50/84* (2023.02); *H10K 59/123* (2023.02); *H10K 59/124* (2023.02); *H10K 59/351* (2023.02); *H10K 71/861* (2023.02)

(58) Field of Classification Search
CPC . H01L 51/56; H01L 27/3213; H01L 27/3248; H01L 27/3258; H01L 51/5044; H01L 51/5237; H01L 2251/568; H01L 51/5234
USPC .......................................................... 257/40
See application file for complete search history.

(56) References Cited

U.S. PATENT DOCUMENTS

| | | | | |
|---|---|---|---|---|
| 2016/0189593 | A1* | 6/2016 | Lee ...................... | G09G 3/3233 438/4 |
| 2020/0388653 | A1* | 12/2020 | Lee ......................... | G06F 3/044 |
| 2020/0411605 | A1* | 12/2020 | Moon ................. | H01L 27/3218 |

FOREIGN PATENT DOCUMENTS

| | | |
|---|---|---|
| KR | 10-2017-0135650 A | 12/2017 |
| KR | 10-2020-0080896 A | 7/2020 |

* cited by examiner

*Primary Examiner* — Xia L Cross
(74) *Attorney, Agent, or Firm* — Polsinelli PC

(57) ABSTRACT

A display device comprises a pixel electrode including a first subpixel electrode and a second subpixel electrode arranged to be spaced apart from each other within at least one subpixel of a plurality of subpixels over a substrate, a driving transistor driving the one subpixel, and a connection electrode structure electrically connecting at least one subpixel of the first subpixel electrode and the second subpixel electrode of the pixel electrode with the driving transistor.

19 Claims, 14 Drawing Sheets

DISPLAY DEVICE HAVING REPAIR STRUCTURE

CROSS-REFERENCE TO RELATED APPLICATION

This application claims the benefit of the Korean Patent Application No. 10-2019-0144371 filed on Nov. 12, 2019 which is hereby incorporated by reference in its entirety.

BACKGROUND

Field of the Disclosure

The present disclosure relates to a display device.

Description of the Background

Recently, with the advancement of the information age, a display field for visually displaying an electric information signal has been rapidly developed. In response to this trend, various display devices having excellent properties of a thin profile, a lightweight, and low power consumption have been developed. Detailed examples of the display devices include a liquid crystal display (LCD) device, a quantum dot display device, a field emission display device, and an organic light emitting display device.

Among the display devices, the organic light emitting display device which does not require a separate light source is considered as a competitive application for a compact device and a clear color display.

Recently, as a display function has been given to a car glass or window or a transparent plate for product exhibition or advertisement as well as standardized television or cellular phone and a monitor, demand for using a display device of complex functions, such as a transparent display device, has been increased.

Characteristic deterioration or internal short malfunction of a thin film transistor may occur in a line of the display device or a manufacturing process of the thin film transistor or a manufacturing process of an organic light emitting diode.

If the thin film transistor is not driven normally, since a current or voltage is not applied to the organic light emitting diode connected with the thin film transistor, one pixel or subpixel becomes a dark spot. Alternatively, if a source electrode and a drain electrode of a driving thin film transistor are shorted, the driving thin film transistor is not driven normally, and a voltage applied to the source electrode is directly applied to the drain electrode without on/off, whereby the subpixel is always maintained at an on-state and therefore a bright spot occurs.

Since a bright spot is easily seen to a user's eyes due to good visibility, the bright spot deteriorates display quality. For this reason, even though only one bright spot occurs over a display area, the display device is regarded to have a defect, whereby a problem occurs in that the display device cannot be manufactured as a final product. Particularly, since a dark spot or a bright spot in a transparent display device or a top emission type large scaled display device is likely to be seen to a user's eyes, a solution that may avoid or minimize the dark spot or the bright spot is required.

SUMMARY

Accordingly, the present disclosure has been made in view of the above problems and to provide a display device comprising a repair line and a connection electrode structure per subpixel for normal driving of the display device to minimize a product defect based on a dark spot or a bright spot and improve process yield. Particularly, the connection electrode structure arranged per subpixel may normally drive a subpixel having a dark spot or a bright spot, and may minimize damage of a subpixel, which may be generated by laser, and reliability deterioration.

In addition to the feature of the present disclosure as mentioned above, additional features of the present disclosure will be clearly understood by those skilled in the art from the following description of the present disclosure.

In accordance with an aspect of the present disclosure, the above and other features can be accomplished by the provision of a display device comprising a pixel electrode including a first subpixel electrode and a second subpixel electrode arranged to be spaced apart from each other in at least one subpixel of a plurality of subpixels over a substrate, a driving transistor driving the at least one subpixel, and a connection electrode structure electrically connecting at least one of the first subpixel electrode and the second subpixel electrode of the pixel electrode with the driving transistor.

In accordance with an aspect of the present disclosure, the above and other features can be accomplished by the provision of a display device comprising a transmissive area transmitting external light of a substrate, a first subpixel electrode arranged in at least one subpixel of a plurality of subpixel arranged adjacent to the transmissive area, a second subpixel electrode arranged to be spaced apart from the first subpixel electrode in the at least one subpixel, a driving transistor driving the at least one subpixel, and a connection electrode structure electrically connecting at least one of the first subpixel electrode and the second subpixel electrode with the driving transistor.

In accordance with an aspect of the present disclosure, the above and other features can be accomplished by the provision of a display device comprising a pixel electrode including a first subpixel electrode and a second subpixel electrode arranged to be spaced apart from each other in at least one subpixel of a plurality of subpixels over a substrate, a driving transistor driving the one subpixel, and a connection electrode structure electrically connecting at least one of the first subpixel electrode and the second subpixel electrode of the pixel electrode with the driving transistor, wherein a repair line is arranged between adjacent subpixels of the plurality of subpixels in a direction crossing the at least one subpixel, and the repair line is partially overlapped with the pixel electrode.

The connection electrode structure may include a first connection electrode extended from a first end of the first subpixel electrode to a first direction, wherein the first direction is a direction which is perpendicular to a direction from the first subpixel electrode to the second subpixel electrode, a second connection electrode extended from a first end of the second subpixel electrode to the first direction, a third connection electrode electrically connected to the driving transistor and extended to the first direction, and a fourth connection electrode having a first end contacted with the first connection electrode and a second end contacted with the second connection electrode, contacted with the third connection electrode between the first end and the second end, and arranged in and contacted with a layer different from at least one of the first to third connection electrodes.

At least one of the first subpixel electrode and the second subpixel electrode may partially be arranged over the driving transistor, and the fourth connection electrode may be arranged over the same layer as an active layer constituting the driving transistor.

The fourth connection electrode may be arranged in a second direction different from or orthogonal to the first direction, and may connect the first connection electrode with the third connection electrode through a bridge or connect the second electrode with the third connection electrode through a bridge.

The present disclosure may comprise a connection electrode structure per subpixel to repair a subpixel having a bright spot or a dark spot, thereby improving product yield and quality of the display device.

As the connection electrode structure includes layers used for a backplane process, an additional process for forming the connection electrode structure is not required, whereby the productivity of the display device may be improved.

If a conductorized active layer is used as a connection electrode for laser cutting of the connection electrode structure, a wavelength range of laser required for a repair process is lower than a wavelength range of laser applied to general metal, whereby a peripheral structure or the other layers may be affected by the connection electrode within a minimum range.

Also, if a conductorized active layer is used as a connection electrode for laser cutting of the connection electrode structure, a wet etching process may be excluded, whereby film uniformity may be prevented from being deteriorated due to the wet etching process and a process margin may be obtained. Moreover, since the conductorized active layer may be arranged by the same process as a process of a thin film transistor, a process of providing the connection electrode structure is simple.

As the connection electrode structure connects connection electrodes arranged over different layers with each other, a thick electrode structure is not applied to the connection electrode for laser cutting, whereby laser cutting energy may be prevented from being increased and occurrence of damage of an organic light emitting diode weak for laser may be reduced.

In the present disclosure, even though a repair process is performed by the laser, since the connection electrode for laser cutting in the connection electrode structure is a conductorized active layer or is not thick, an encapsulation layer may be prevented from being damaged by laser, whereby reliability of a product may be prevented from being deteriorated.

In addition to the effects of the present disclosure as mentioned above and additional features of the present disclosure will be clearly understood by those skilled in the art from the following description of the present disclosure.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
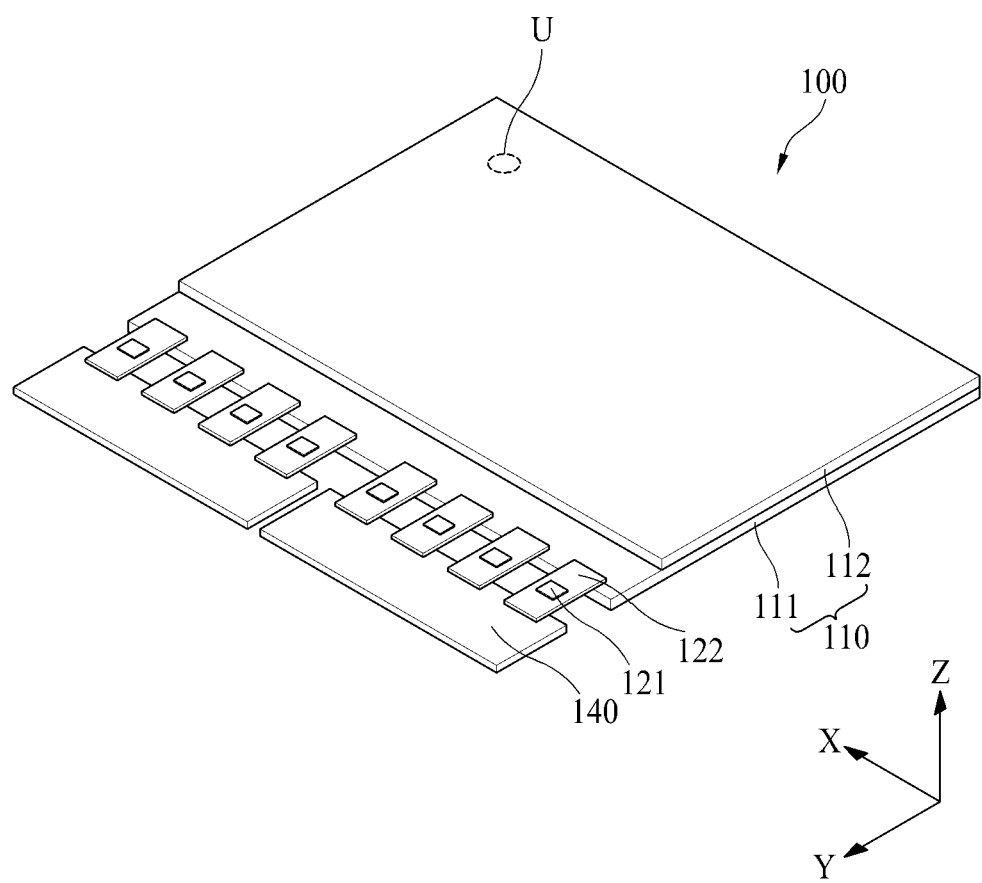
FIG. 1 is a perspective view briefly illustrating a display device according to the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

The expression that an element is "connected" or "coupled" to another element should be understood that the element may directly be connected or coupled to another element but may directly be connected or coupled to another element unless specially mentioned, or a third element may be interposed between the corresponding elements.

In describing elements of the present disclosure, the terms "first", "second", etc. may be used. These terms are intended to identify the corresponding elements from the other elements, and basis, order, or number of the corresponding elements are not limited by these terms.

The term "at least one" should be understood as including any and all combinations of one or more of the associated listed items.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Titles of elements used in this specification are selected considering easiness in drafting the specification, and may be different from component titles of a real product.

Hereinafter, the aspects of the display device according to the present disclosure will be described in detail with reference to the accompanying drawings.

Wherever possible, the same reference numbers will be used throughout the drawings to refer to the same or like parts.

Referring to FIG. 1, a display device 100 includes a panel 110 and driving circuits for driving the display panel 110.

The display panel 110 may be a bonded type of a substrate 111 and an upper substrate 112. The substrate 111 and the upper substrate 112 may be glass substrates.

For example, the substrate 111 may include SiO2 or Al2O3 as a main component. At least one of the substrate 111 and the upper substrate 112 may be a flexible substrate. For example, the substrate 111 may include a transparent polyimide material. Considering that a deposition process of a high temperature is performed, polyimide having excellent heat resistance tolerable for a high temperature may be used as the substrate 111 of a polyimide material.

The panel 110 may include a display area and a non-display area. The display area is an area where an image is displayed, and may correspond to an active area of a pixel array. The non-display area is an area where an image is not displayed, and may be an edge portion of the panel 110 surrounding the display area. The driving circuits may be connected to at least one side of the non-display area as shown in FIG. 1.

The driving circuits are connected to a pad electrode (not shown) provided in the non-display area of the substrate 111, and supplies image data of a display driving system to the panel 110. According to one example, the driving circuits include a plurality of circuit films 122, a plurality of data driving integrated circuits 121, and a printed circuit board 140. The driving circuits may further include a timing controller (not shown). A gate driving integrated circuit may be arranged at an edge of the substrate 111 in the form of Gate In Panel (GIP) and overlaid by the upper substrate 112. Although not shown, the gate driving integrated circuit may be arranged in a separate circuit film in the form of a chip on film (COF) or may be arranged at one edge of the substrate 111 in the form of Chip On Glass (COG) or Chip On Panel (COP).

According to one example, each of the plurality of circuit films 122 may be embodied as a flexible circuit film and then bent to reduce a bezel area of the display device 100.

Each of the data driving integrated circuits 121 may be packaged in each of the plurality of circuit films 122. Each of the data driving integrated circuits 121 may receive pixel data and a data control signal provided from a timing controller (not shown), and may supply the pixel data to a data line in accordance with the data control signal by converting the pixel data to analog type data signal per pixel.

The printed circuit board 140 may transfer signals and power sources between the timing controller (not shown) and the driving circuits. Signal transmission lines and various power lines may be provided at the printed circuit board 140. For example, one or more printed circuit boards 140 may be provided depending on the size of the panel 110 or the number of circuit films 122.

A plurality of units U for embodying an image or embodying a transparent by transmitting external light is arranged over the display area of the panel 110.

Figure 2:
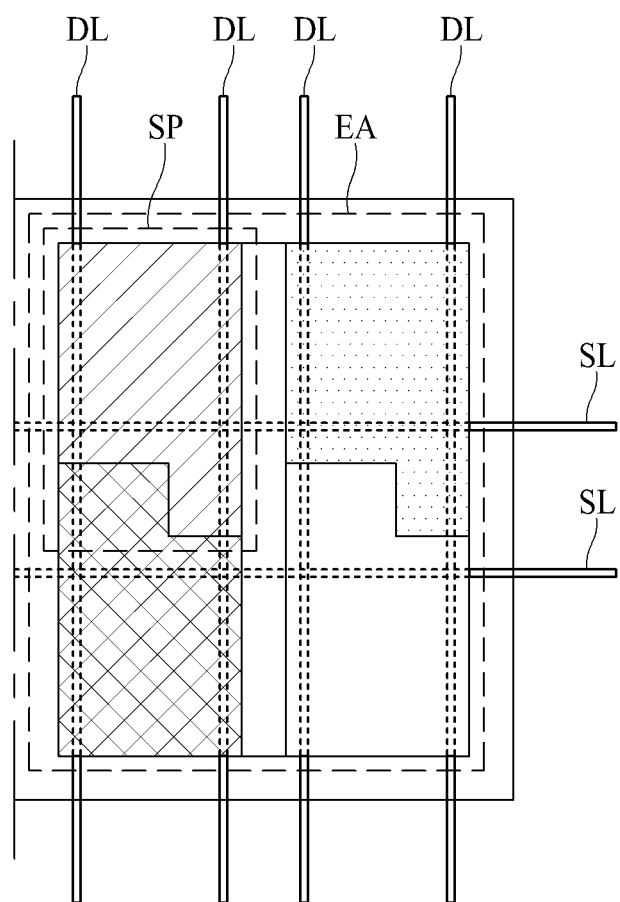
FIG. 2 is a view illustrating one example of a unit of a display device according to FIG. 1.

Referring to FIG. 2, one unit U includes a plurality of subpixels SP, a plurality of data lines DL and a plurality of scan lines SL, which are arranged in a light emissive area EA. Although the following drawings show that one unit U includes a transmissive area TA, the display device according to the present specification is not limited to this example, and may be a display device that does not include a transmissive area TA.

Figure 3A:
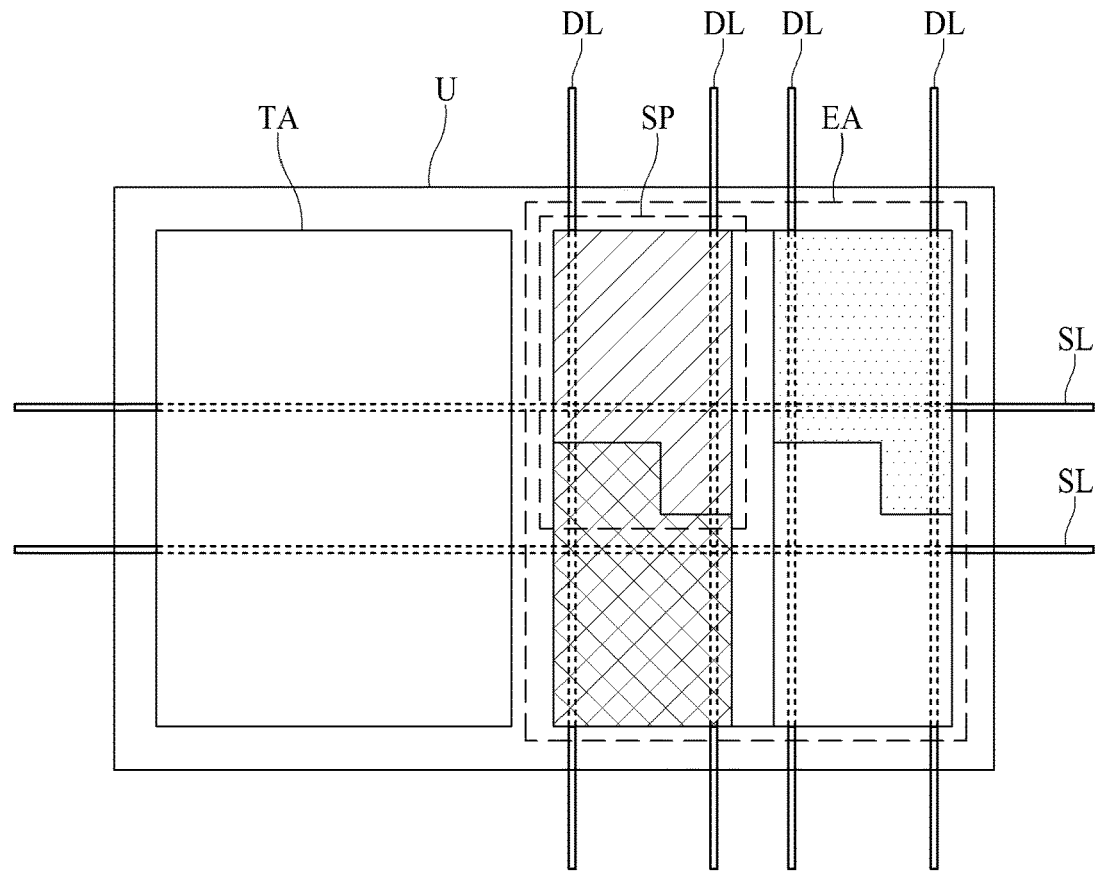
FIGS. 3A and 3B are views illustrating another example of a unit of a display device according to FIG. 1.
Figure 3B:
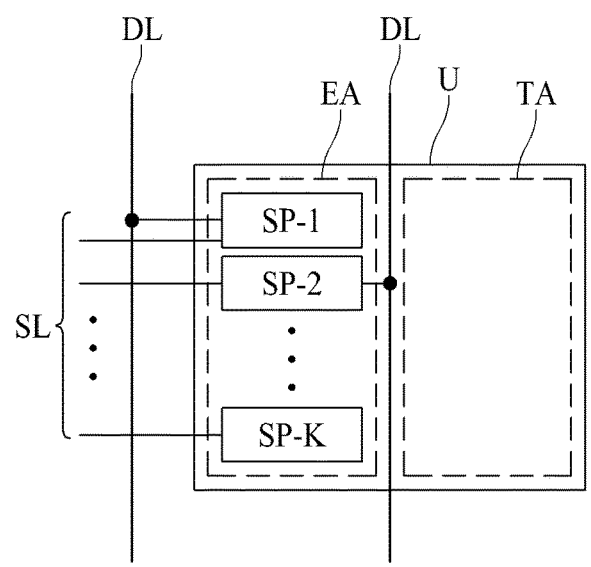

The unit U of the display device, as shown in FIGS. 3A and 3B, may include one transmissive area TA and a light emissive area EA corresponding to one transmissive area TA, as another aspect.

Since the transmissive area TA should transmit external light and improve transmittance, a light emissive area and lines are arranged in the transmissive area TA within a minimum range. A scan line SL crossing the transmissive area TA may be arranged in the transmissive area TA. The scan line SL arranged in the transmissive area TA may include a transparent conductive film.

The light emissive area EA includes a plurality of subpixels for embodying an image, and a plurality of data lines DL may be arranged in the light emissive area EA to correspond to the number of a plurality of subpixels (SP). The scan line SL may be arranged in the light emissive area EA in a direction orthogonal to the data line DL. The scan line SL may be at least one of a line for applying a gate signal and a sensing line for compensation. The scan line SL may be arranged as much as the number of subpixels SP arranged in a direction of one data line DL with respect to one unit U.

For example, if four subpixels SP are arranged in the light emissive area EA with respect to one unit U, four data lines DL corresponding to four subpixels SP may be arranged to cross the light emissive area EA in a vertical direction, and the scan line SL may be arranged to cross the light emissive area EA in a direction crossing the data line DL.

The plurality of subpixels SP may include four subpixels SP expressing different colors corresponding to one transmissive area TA in the form quad. At least one SP of the plurality of subpixels SP may indicate at least one of red light, green light, blue light and white light.

Since each unit U includes the transmissive area TA, each unit may have a transparent structure. In accordance with the structure of the unit U that includes the transmissive area TA, the display device according to the present specification may embody a transparent display.

In one unit U according to another example of the display device, as shown in FIGS. 3A and 3B, a plurality of subpixels SP-1, SP-2, . . . , SP-K may be arranged in the light emissive area EA corresponding to one transmissive area TA in a direction parallel with the data lines DL.

The data lines DL may be arranged by interposing the light emissive area EA as much as the plurality of subpixels SP-1, SP-2, . . . , SP-K. Since each of the plurality of subpixels SP-1, SP-2, . . . , SP-K is arranged in the light emissive area EA in a direction parallel with the data lines DL, the scan lines SL may be arranged as much as the number of the subpixels SP-1, SP-2, . . . , SP-K. In this case, K that means the number of subpixels included in one light emissive area EA may be at least one natural number of 2 to 6.

An arrangement structure of the plurality of subpixels, the transmissive area and the light emissive area may be designed in various combinations without limitation to FIGS. 2 to 3B.

Figure 4:
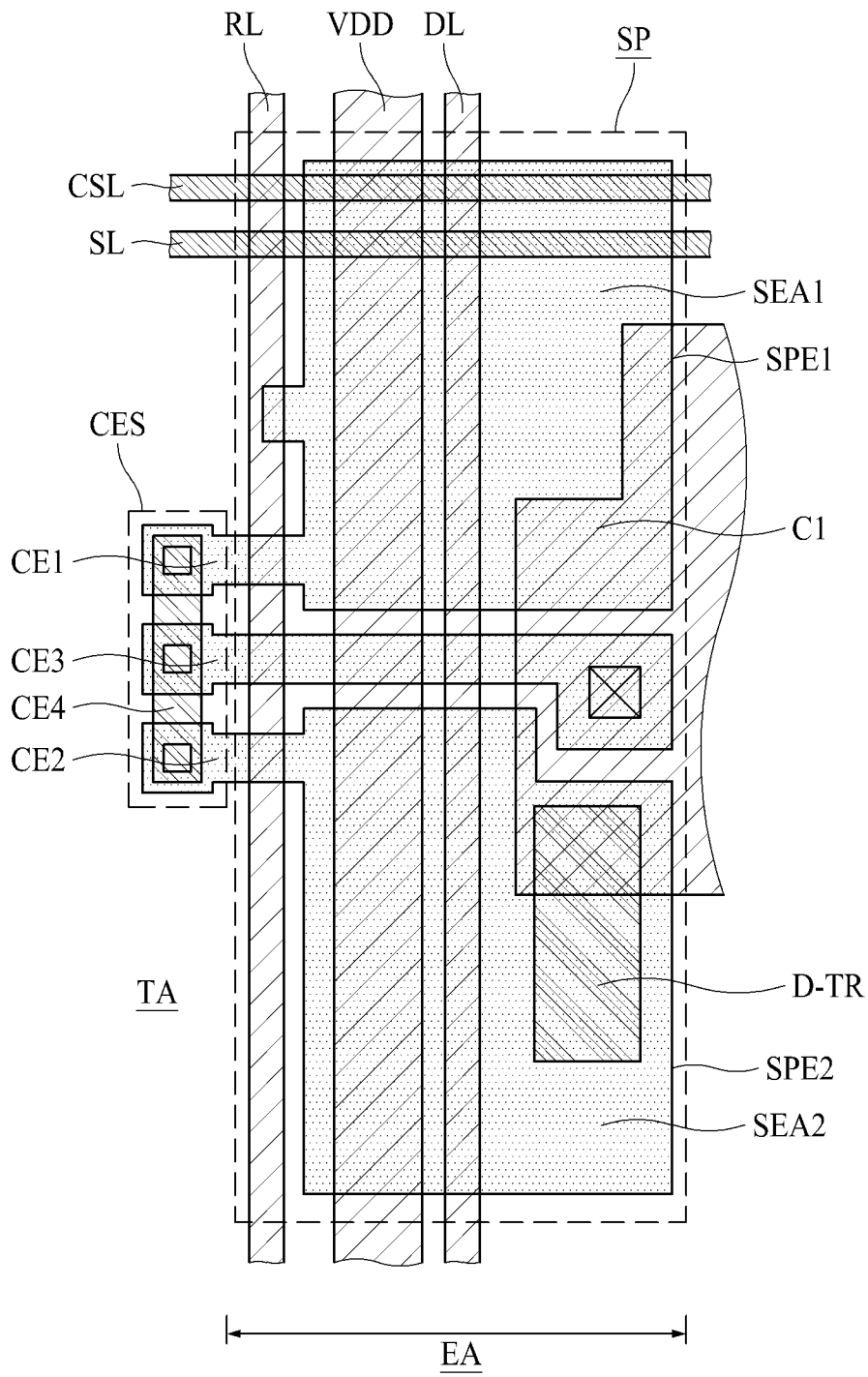
FIG. 4 is a view illustrating a subpixel of a unit shown in FIG. 1.
Figure 5:
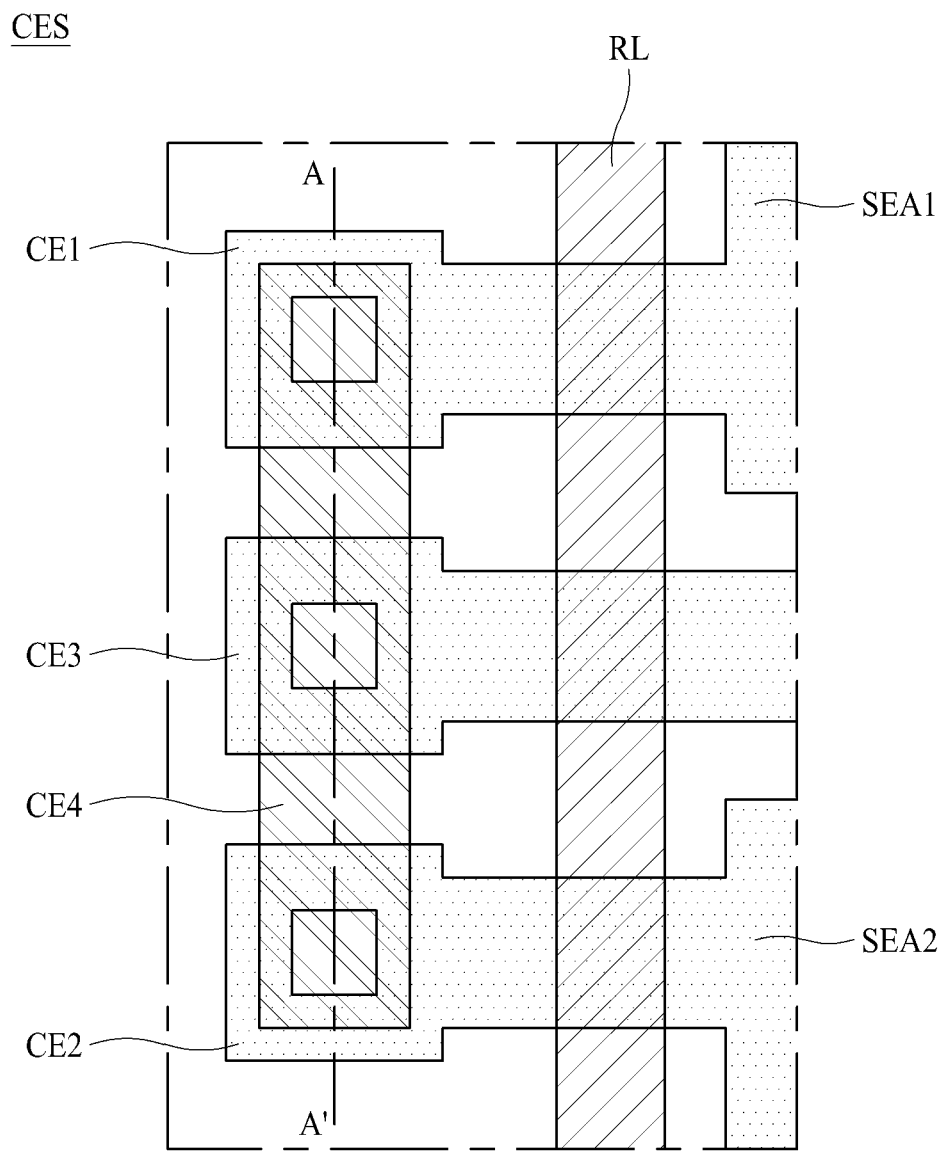
FIG. 5 is an enlarged view illustrating a connection electrode structure of FIG. 4.
Figure 6:
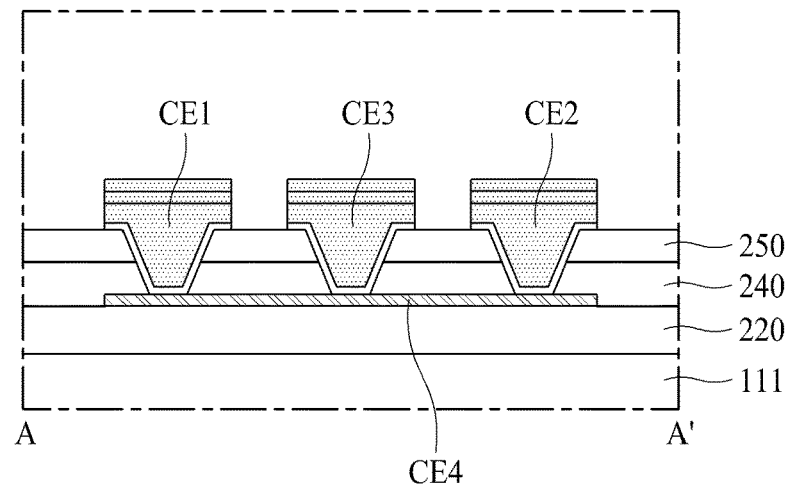
FIG. 6 is a cross-sectional view illustrating a connection electrode structure of FIG. 5, taken along line A-A'.

Referring to FIGS. 4 to 6, at least one SP of the plurality of subpixels SP arranged in the light emissive area EA includes pixel electrodes and a driving transistor D-TR. If the display device according to the present disclosure embodies a transparent display device, the plurality of subpixels SP may be arranged adjacent to the transmissive area. If the display device according to the present disclosure embodies a general display device, the plurality of subpixels SP may be arranged in the light emissive area adjacent to the light emissive area EA.

The scan line SL and the sensing line CSL crossing the subpixel SP may be arranged in the subpixel SP in a direction different from a voltage line VDD or the data line DL. The scan line SL and the sensing line CSL may be arranged between adjacent subpixels SP in a direction of the voltage line VDD or the data line DL. The scan line SL may be a gate signal line for applying a gate signal to the subpixel SP.

A repair line RL may be arranged in the subpixel SP in the same direction as the voltage line VDD or the data line DL. The repair line RL may be arranged between adjacent subpixels SP in a direction crossing the subpixel SP and the data line DL. The repair line RL may be arranged to partially overlap or cross at least one of the scan line SL, the sensing line CSL and the connection electrode structure CES. The repair line RL may partially be overlapped with the pixels electrodes.

The pixel electrodes include a first subpixel electrode SPE1 and a second subpixel electrode SPE2 arranged to be spaced apart from each other in at least one subpixel SP, and the first and second subpixel electrodes are electrically connected to one driving transistor D-TR. At this time, the pixel electrodes are connected with the connection electrode structure CES for electrically connecting at least one of the first subpixel electrode SPE1 and the second subpixel electrode SPE2 with the driving transistor D-TR.

A conductive layer extended from source/drain electrodes of the driving transistor D-TR, constituting a first electrode of a capacitor C1 is in contact with a third connection electrode CE3 of the connection electrode structure CES. At least one of the first subpixel electrode SPE1 and the second subpixel electrode SPE2 may partially be arranged over the driving transistor D-TR.

Since the first subpixel electrode SPE1 and the second subpixel electrode SPE2 are electrically connected to one driving transistor D-TR through the connection electrode structure CES, a first sub emissive part SEA1 corresponding to the first subpixel electrode SPE1 and a second sub emissive part SEA2 corresponding to the second subpixel electrode SPE2 may be driven at the same time. The first subpixel electrode SPE1 may be in contact with the repair line RL. At this time, at least a portion of the first subpixel electrode SPE1 is protruded to overlap at least a portion of the repair line RL.

At least one of the first subpixel electrode SPE1 and the second subpixel electrodes SPE2 may include at least one of ITO, MoTi, Al, Ag, Mo, Ti and Cu, or may be provided with a deposited structure of at least one of ITO, MoTi, Al, Ag, Mo, Ti and Cu. At least one of the first subpixel electrode SPE1 and the second subpixel electrodes SPE2 may include a deposited structure of ITO/MoTi/Cu/ITO or ITO/Mo/Cu/ITO.

If at least one of the first subpixel electrode SPE1 and second subpixel electrodes SPE2 includes MoTi or Mo, these electrodes may serve as reflective panels, whereby the cavity effect of OLED may be enhanced. The display device according to the present disclosure corresponds to a top emissive mode, and at least one of the first subpixel electrode SPE1 and the second subpixel electrode SPE2 includes at least one conductor of MoTi, Al, Ag, Mo, Ti and Cu, which serves as a reflective panel, wherein the conductor serving as a reflective panel improves light emissive efficiency.

At least one of the first subpixel electrode SPE1 and the second subpixel electrode SPE2 may have a thickness of 3000 Å to 6000 Å.

The connection electrode structure CES for electrically connecting the driving transistor D-TR with the pixel electrodes may be provided to be protruded to one side of the pixel electrodes, and the connection electrode structure CES may partially be arranged between the first subpixel electrode SPE1 and the second subpixel electrode SPE2.

The connection electrode structure CES includes a first connection electrode CE1 extended from a first end of the first subpixel electrode SPE1 to a first direction, wherein the first direction is a direction which is perpendicular to a direction from the first subpixel electrode to the second subpixel electrode, a second connection electrode CE2 extended from a first end of the second subpixel electrode SPE1 to the first direction, a third connection electrode CE3 electrically connected to the driving transistor D-TR and extended to the first direction, and a fourth connection electrode CE4 having a first end contacted with the first connection electrode CE1 and a second end contacted with the second connection electrode CE2, contacted with the third connection electrode CE3 between the first end and the second end. At this time, the fourth connection electrode CE4 is arranged in a layer different from at least one of the first to third connection electrodes CE1 to CE3 and contacted with the first to third connection electrodes CE1 to CE3.

The first connection electrode CE1, the second connection electrode CE2 and the third connection electrode CE3 are spaced apart from one another and arranged in parallel. The first connection electrode CE1 may be formed in a single body with the first subpixel electrode SPE1, and the second connection electrode CE2 may be formed in a single body with the second subpixel electrode SPE2. The third connection electrode CE3 is spaced apart from the first subpixel electrode SPE1 and the second subpixel electrode SPE2 and arranged between the first subpixel electrode SPE1 and the second subpixel electrode SPE2.

The third connection electrode CE3 may be made of the same material as a material constituting at least one of the first subpixel electrode SPE1, the second subpixel electrode SPE2, the first connection electrode CE1 and the second connection electrode CE2, or may be arranged in the same layer as at least one of the first subpixel electrode SPE1, the second subpixel electrode SPE2, the first connection electrode CE1 and the second connection electrode CE2. The third connection electrode CE3 connected with the driving transistor may electrically be connected with the first connection electrode CE1 and the second connection electrode CE2 to drive the first sub emissive part SEA1 corresponding to the first subpixel electrode SPE1 and the second sub emissive part SEA2 corresponding to the second subpixel electrode SPE2 through one driving transistor.

The connection electrode CE4 may be arranged in a second direction different from or vertical to the first direction where the first to third connection electrodes CE1 to CE3 are arranged and electrically connects the first connection electrode CE1, the second connection electrode CE2 and the third connection electrode CE3 with one another. The fourth connection electrode CE4 is arranged in a layer different from at least one of the first connection electrode CE1, the second connection electrode CE2 and the third connection electrode CE3. The fourth connection electrode CE4 connects the first connection electrode CE1 with the third connection electrode CE3 through a bridge, or connects the second connection electrode CE2 with the third connection electrode CE3 through a bridge.

The fourth connection electrode CE4 may be arranged in the same layer as an active layer constituting the driving thin film transistor, and may be arranged over a buffer layer 220 over the substrate 111. The first connection electrode CE1, the second connection electrode CE2 and the third connection electrode CE3 are contacted with the fourth connection electrode CE4 through a contact hole that passes through first and second insulating films 240 and 250 arranged over the fourth connection electrode CE4. The fourth connection electrode CE4 may be made of the same material as that of the active layer constituting the driving thin film transistor. At this time, the active layer may be an oxide semiconductor layer such as IGZO.

At least one of the first connection electrode CE1, the second connection electrode CE2 and the third connection electrode CE3 may include at least one of ITO, MoTi, Al, Ag, Mo, Ti and Cu, or may be provided with a deposited structure of at least one of ITO, MoTi, Al, Ag, Mo, Ti and Cu. At least one of the first connection electrode CE1, the second connection electrode CE2 and the third connection electrode CE3 may include a deposited structure of ITO/MoTi/Cu/ITO. At least one of the first connection electrode CE1, the second connection electrode CE2 and the third connection electrode CE3 may have a thickness of 3000 Å to 6000 Å.

The fourth connection electrode CE4 may include the same material as that of the active layer constituting the driving transistor, and may be an oxide semiconductor layer. The fourth connection electrode CE4 may have a thickness of 500 Å or less.

Figure 7:
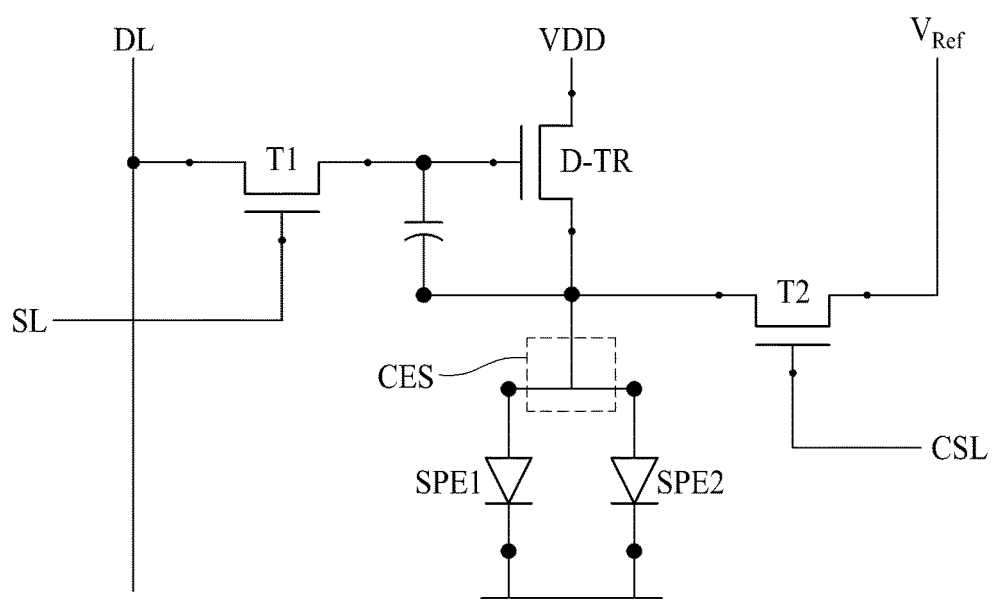
FIG. 7 is a circuit scheme of a subpixel of FIG. 4.
Figure 8:
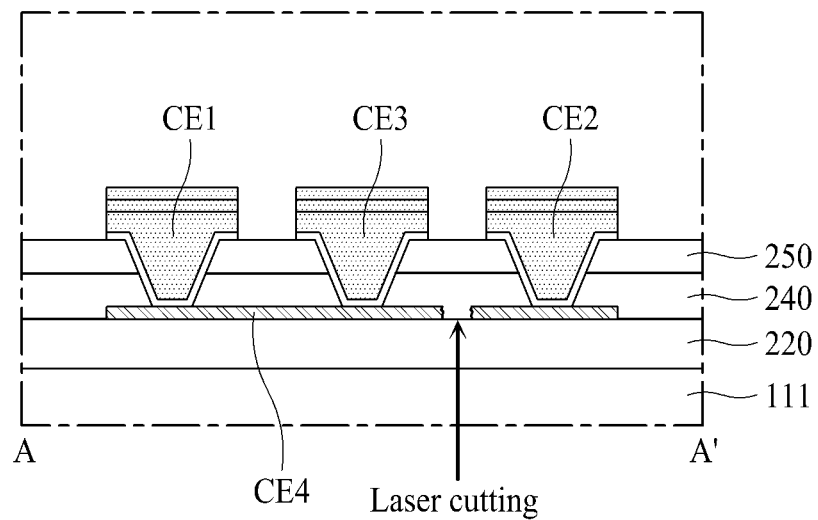
FIG. 8 is a view illustrating that a portion of a connection electrode structure of FIG. 6 is subjected to laser cutting.
Figure 9:
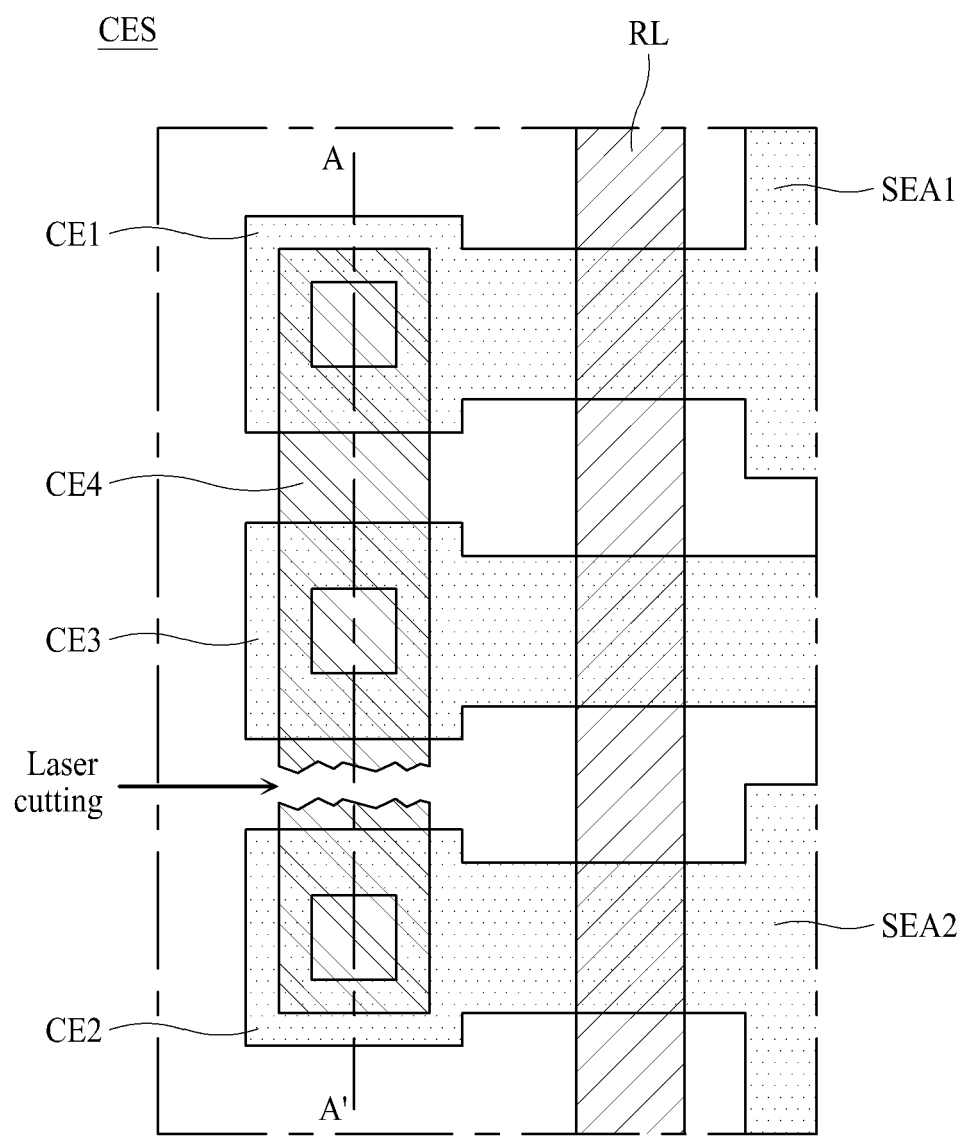
FIGS. 9 to 11 are views illustrating that the present disclosure comprises a connection electrode structure which is subjected to laser cutting.
Figure 10:
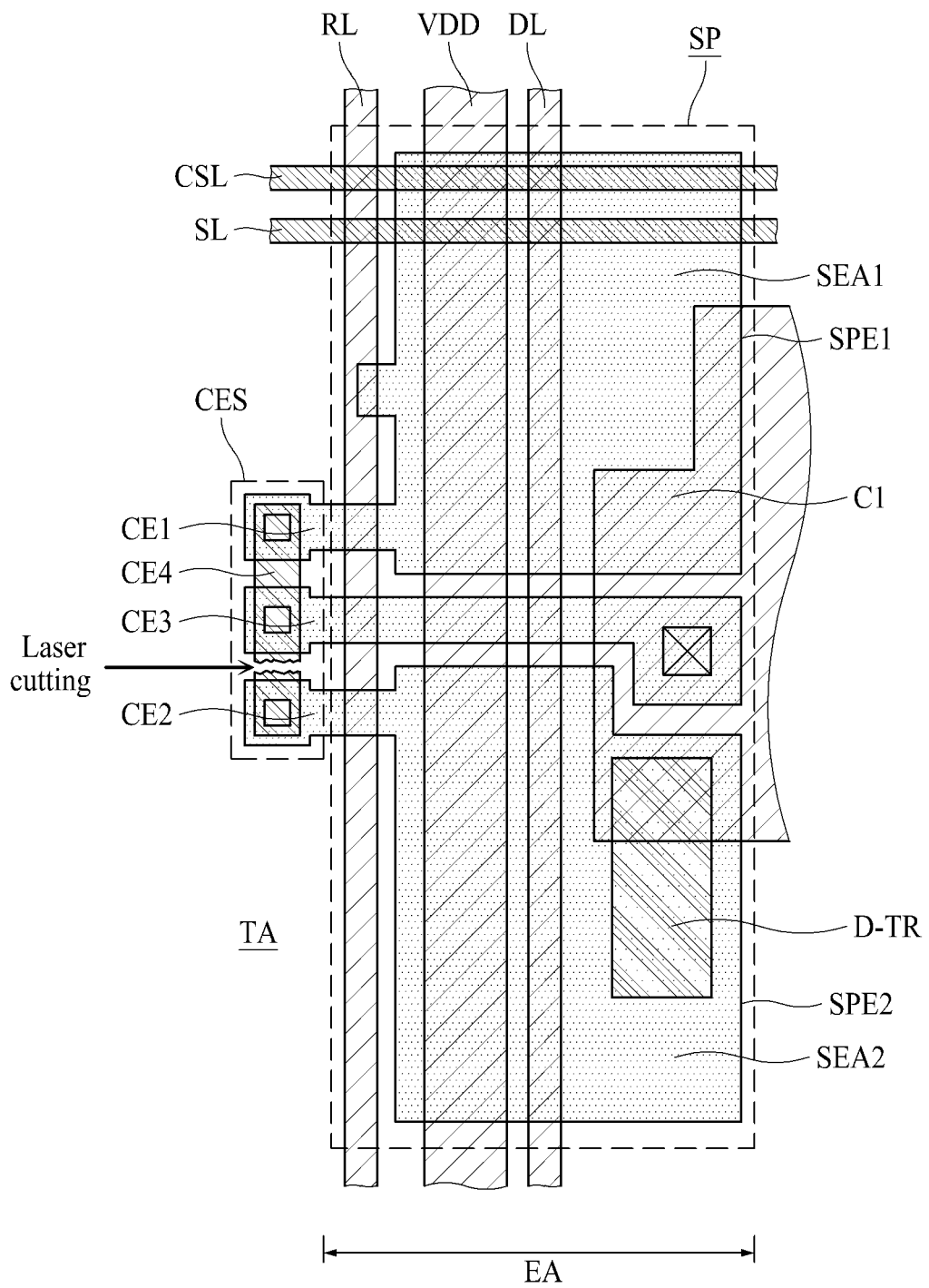
Figure 11:
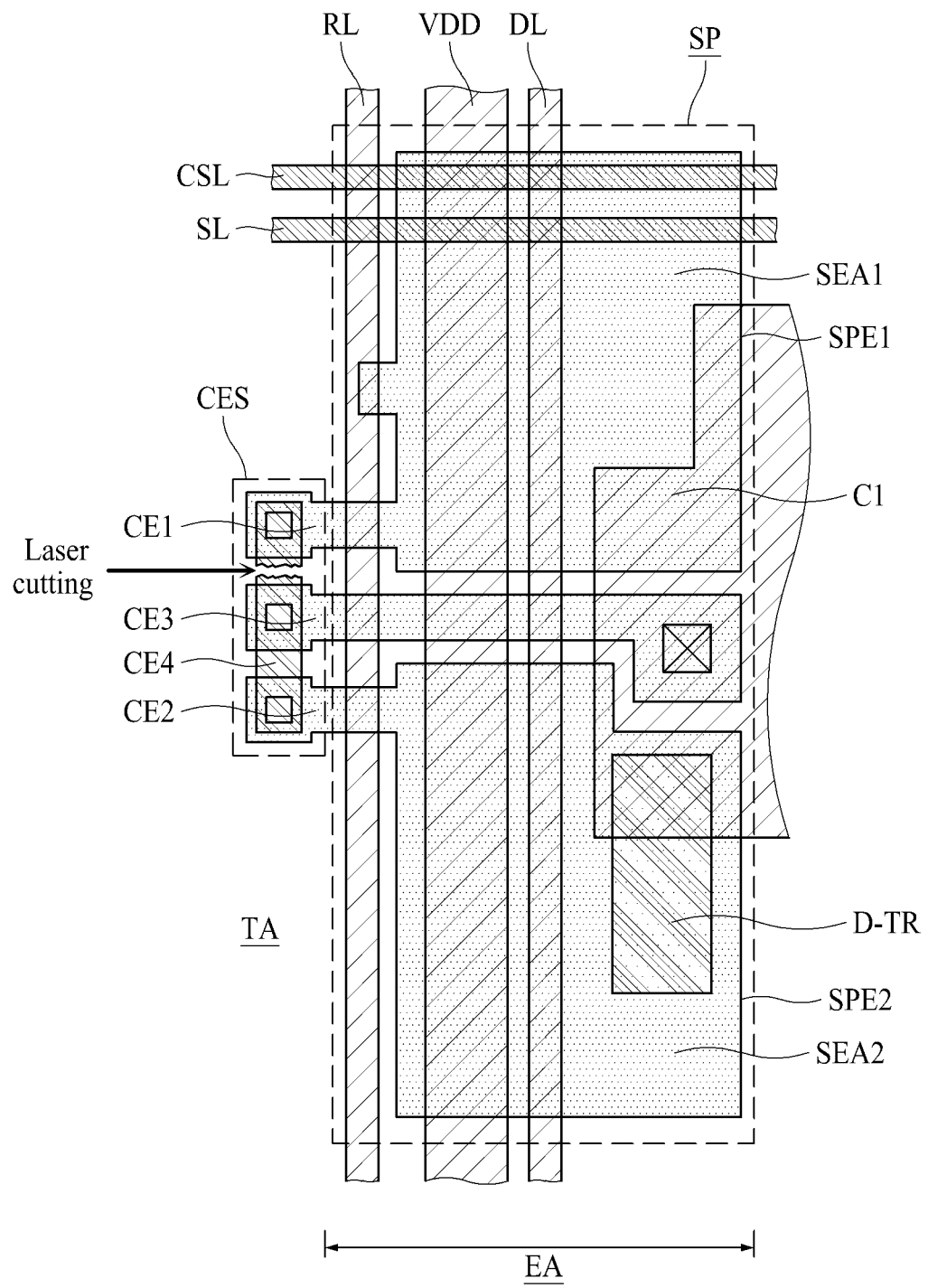

Referring to FIG. 7, the driving transistor D-TR and at least two switching transistors T1 and T2 may be required to drive the subpixel SP. A gate electrode of the first switching transistor T1 is connected with the scan line SL to supply a signal of the data line DL connected to source/drain electrodes of the first switching transistor Ti to a gate electrode of the driving transistor D-TR.

The driving transistor D-TR applies a voltage VDD connected to source/drain electrodes at one side of the driving transistor D-TR to the first subpixel electrode SPE1 and the second subpixel electrode SPE2 in response to a signal of the gate electrode. At this time, the connection electrode structure CES is electrically connected between the source/drain electrodes at the other side of the driving transistor D-TR and the first and second subpixel electrodes SPE1 and SPE2 to apply a voltage or current of the source/drain electrodes at the other side of the driving transistor D-TR to the first and second subpixel electrodes SPE1 and SPE2 through the connection electrode structure CES. The second switching transistor T2 is connected to the source/drain electrodes at the other side of the driving transistor D-TR, a gate electrode of the second switching transistor T2 is connected to the sensing line CSL, and a reference voltage Vref is connected to one side of source/drain electrodes of the second switching transistor T2.

Referring to FIGS. 8 to 11, if a dark spot or a bright spot occurs in any one subpixel SP of the display panel, laser cutting may be subjected to a portion of the fourth connection electrode CE4 of the connection electrode structure CES, whereby the first subpixel electrode SPE1 or the second subpixel electrode SPE2 from one subpixel SP may electrically be connected with the driving transistor D-TR.

For example, laser cutting may be performed for the fourth connection electrode CE4 between the second connection electrode CE2 and the third connection electrode CE3, whereby the second subpixel electrode SPE2 connected to the second connection electrode CE2 is electrically disconnected from the driving transistor D-TR and the second light emissive area corresponding to the second subpixel electrode SPE2 becomes a floating state. At this time, the first subpixel electrode SPE1 may electrically be connected to the driving transistor D-TR through the third connection electrode CE3 electrically connected with the driving transistor D-TR through the first connection electrode CE1 and the fourth connection electrode CE4, and therefore may be driven.

That is, even though a dark spot or a bright spot occurs in one subpixel SP, laser cutting may be performed for the fourth connection electrode CE4 to float one sub emissive part, whereby the subpixel may be driven normally.

Although showing that laser cutting is performed for the fourth connection electrode CE4 between the second connection electrode CE2 and the third connection electrode CE3, laser cutting may be formed for the fourth connection electrode CE4 between the first connection electrode CE1 and the third connection electrode CE3.

If a dark spot or a bright spot occurs in the first light emissive area corresponding to the first subpixel electrode SPE1, laser cutting may be performed for the fourth connection electrode CE4 between the first connection electrode CE1 and the third connection electrode CE3, whereby the first subpixel electrode SPE1 connected to the first connection electrode CE1 is electrically disconnected from the driving transistor D-TR and the first sub emissive part corresponding to the first subpixel electrode SPE1 becomes a floating state. At this time, the second subpixel electrode SPE2 may electrically be connected to the driving transistor D-TR through the third connection electrode CE3 electrically connected with the driving transistor D-TR through the second connection electrode CE2 and the fourth connection electrode CE4, and therefore may be driven.

Even though a dark spot or a bright spot occurs in one subpixel SP, laser cutting may be performed for the fourth connection electrode CE4 to drive the second sub emissive part, whereby the subpixel may be driven normally.

If a dark spot or a bright spot occurs in one subpixel SP, the first connection electrode CE1 and the fourth connection electrode CE4 arranged over a layer different from the third connection electrode CE3 may be separated from each other between the first connection electrode CE1 and the third connection electrode CE3, and the second connection electrode CE2 and the fourth connection electrode CE4 arranged over a layer different from the third connection electrode CE3 may be separated from each other between the second connection electrode CE2 and the third connection electrode CE3.

If a dark spot or a bright spot does not occur in one subpixel SP, the fourth connection electrode CE4 electrically connects the first connection electrode CE1, the second connection electrode CE2 and the third connection electrode CE3 with one another as described above.

If the fourth connection electrode CE4 is made of the same material as that of the other electrodes CE1, CE2 and CE3 or made of metal, energy is increased when the laser cutting is performed, and laser is reflected by metal to lower an absorption rate, whereby a power consumed for cutting is increased and therefore damage of the device may be increased. However, if the fourth connection electrode CE4 subjected to laser cutting is made of an oxide semiconductor layer, an absorption rate is high even at a low wavelength range to enable cutting.

Also, a wavelength band for cutting the fourth connection electrode CE4 made of an oxide semiconductor layer does not react with adjacent metals, whereby the fourth connection electrode CE4 may only be cut, and damage to the OLED is not caused. If the fourth connection electrode CE4 has a thickness of 3000 Å to 6000 Å like the first to third connection electrodes CE1, CE2 and CE3, energy is increased when laser cutting is performed, whereby adjacent layers may be damaged. However, since the fourth connection electrode CE4 has a thickness of 500 Å or less, energy is less consumed during laser cutting, whereby damage that may be given to adjacent layers may be minimized. Particularly, since the fourth connection electrode CE4 is arranged by the same process as that of the active layer of the driving transistor, an additional process is not required, whereby productivity may be prevented from being reduced.

Figure 12:
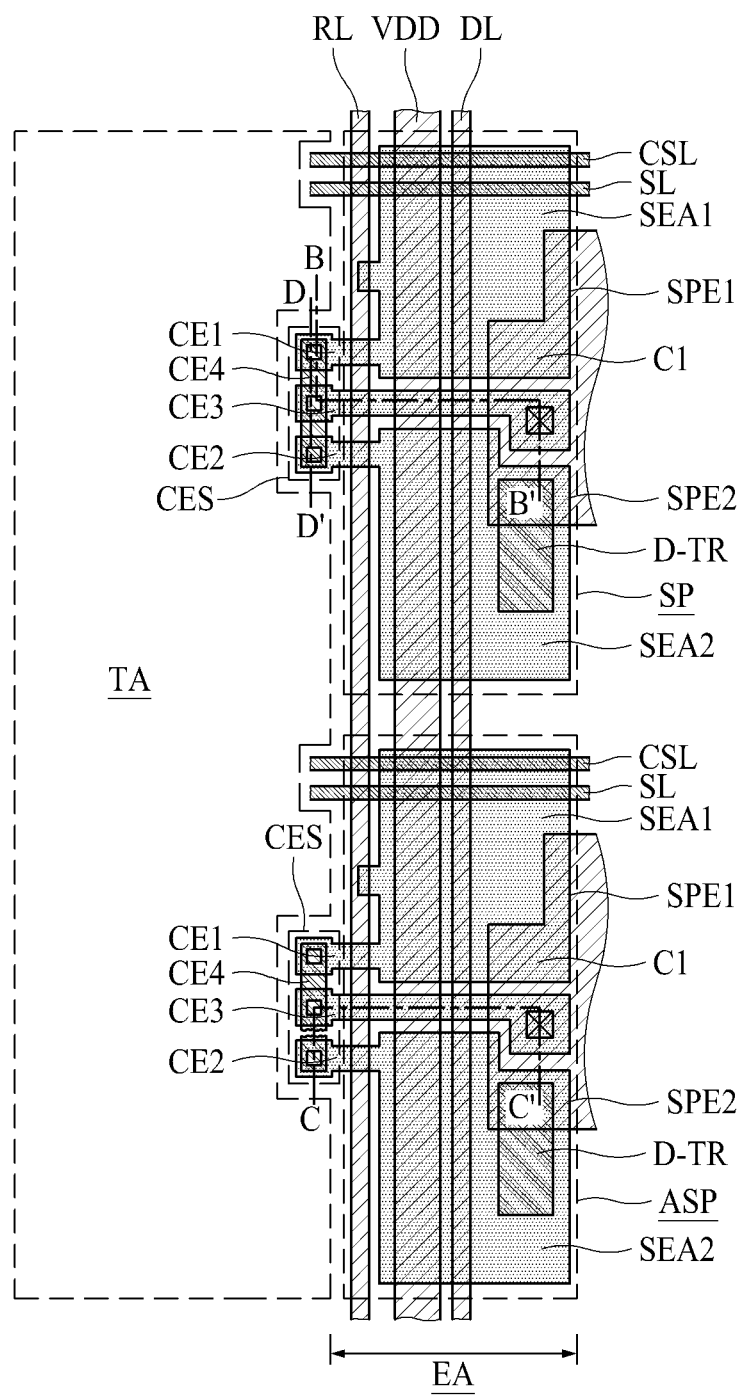
FIG. 12 is a view illustrating a display device according to another aspect of the present disclosure.
Figure 13A:
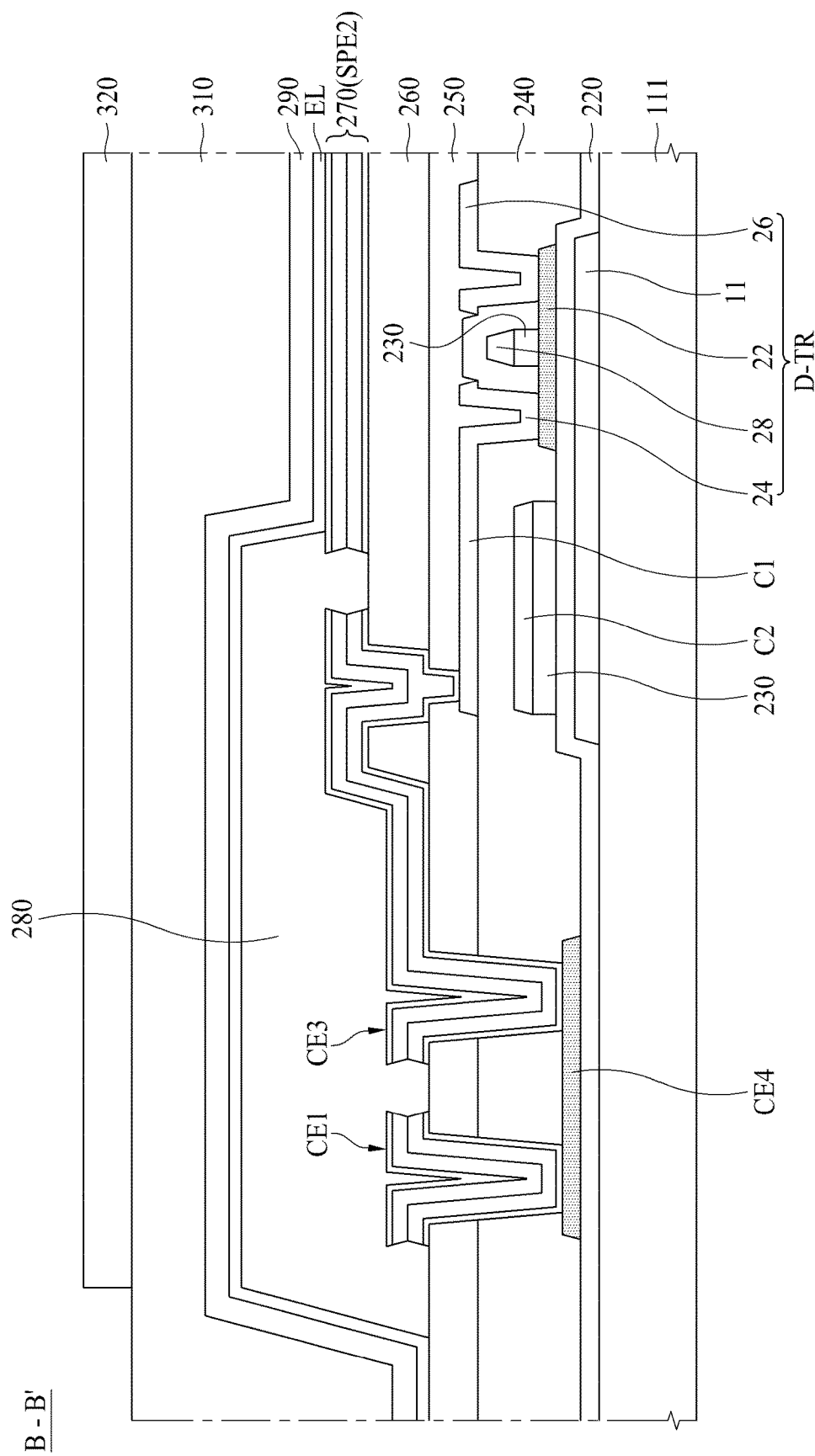
FIG. 13A is a cross-sectional view taken along line B-B' of FIG. 12.
Figure 13B:
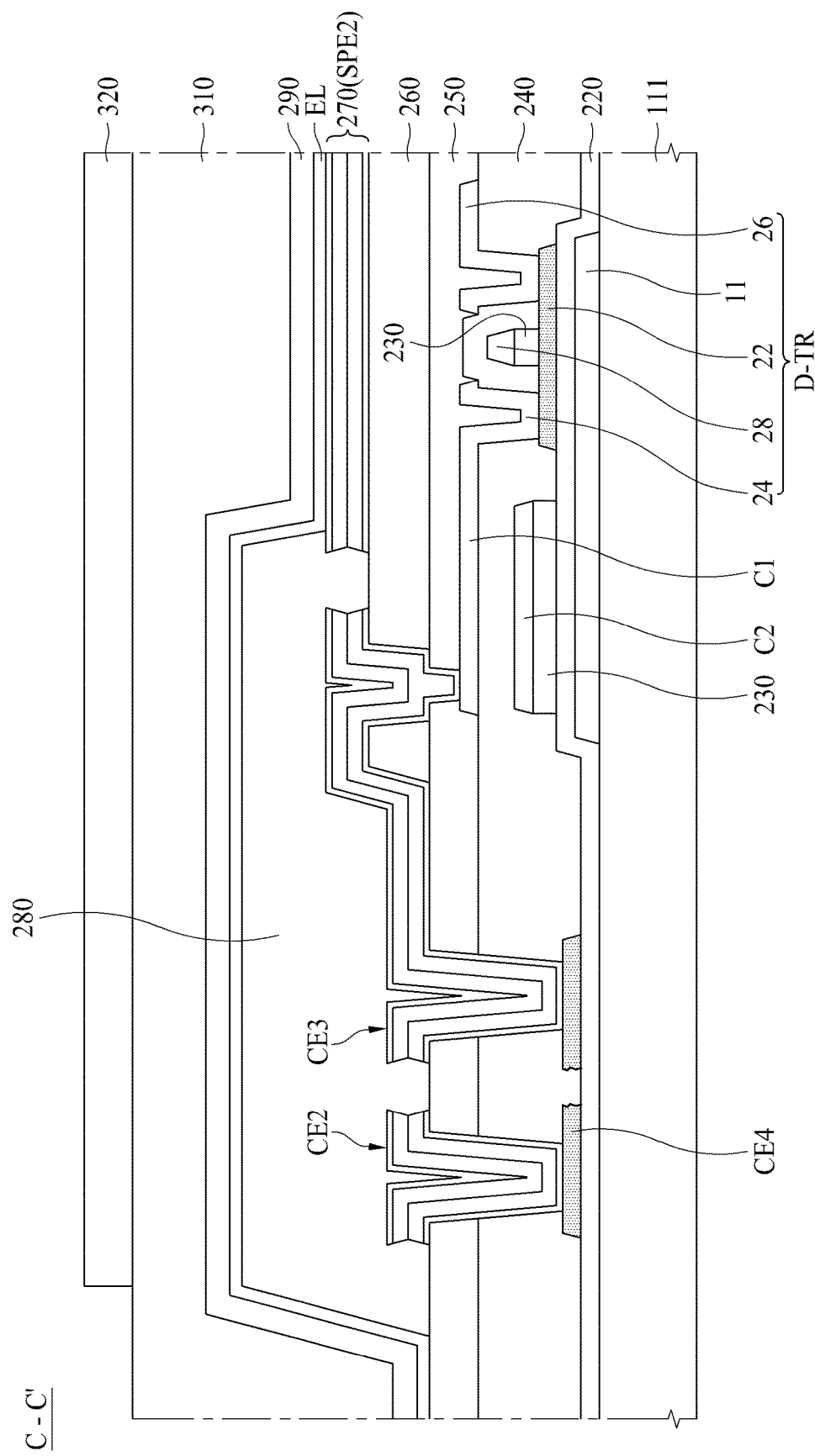
FIG. 13B is a cross-sectional view taken along line C-C' of FIG. 12.
Figure 13C:
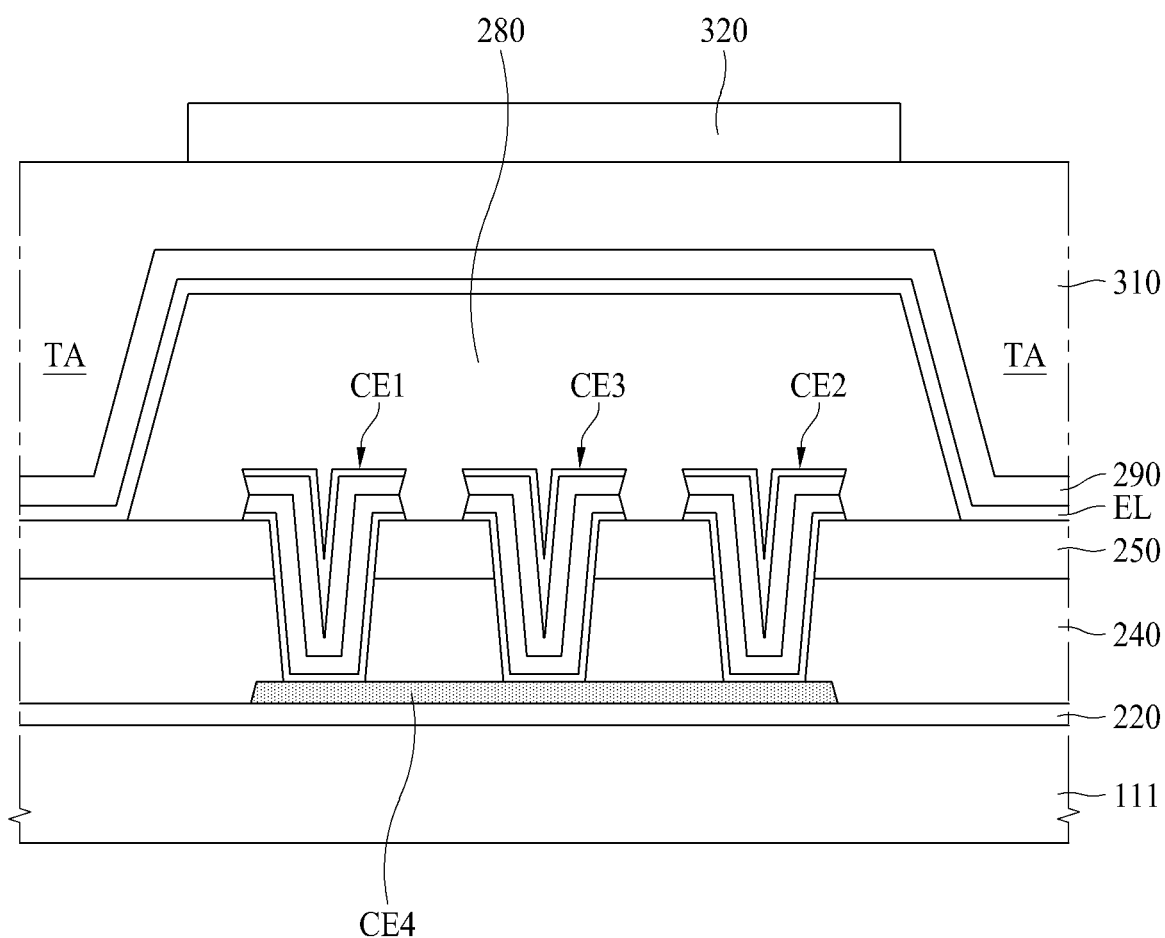
FIG. 13C is a cross-sectional view taken along line D-D' of FIG. 12.

The display device according to one aspect of the present disclosure may embody the transparent display device. At this time, the display device is as shown in FIGS. 12 to 13C, and the display device includes a substrate 111, a transmissive area TA transmitting light outside the substrate 111, and a light emissive area EA arranged adjacent to the transmissive area TA, wherein the light emissive area EA displays an image.

The transmissive area TA may include a deposited structure of a substrate 111, a buffer layer 220, a first insulating film 240, a second insulating film 250, an organic light emitting diode EL, a cathode electrode 290, and an encapsulation layer 310. The deposited structure of the transmissive area TA may be used without limitation if it is a deposited structure of the transmissive area TA known in the art.

The substrate 111 may be a glass substrate. For example, the substrate 111 may include SiO2 or Al2O3 as the main component.

The buffer layer 220 may be arranged over the transmissive area TA and the light emissive area EA, and may include any one of a silicon nitride film (SiNx), a silicon oxide film (SiOx) and SiON, or may be a deposited structure that includes a plurality of layers made by the combination of SiNx, SiOx and SiON. The buffer layer 220 may be formed over the entire upper surface of the substrate 111 to prevent water from being permeated into the light emitting diode through the substrate 111. As the buffer layer 220 includes a plurality of inorganic films, the buffer layer 220 may improve a water vapor transmission rate (WVTR) of a panel.

An organic diode layer EL arranged in the transmissive area TA is arranged over the second insulating film 250, and is an organic common layer constituting an OLED and includes a hole transporting layer, a hole injecting layer, an electron transporting layer and a electron injecting layer. The organic diode layer EL of the transmissive area TA may not include an organic light emitting layer.

Alternatively, the organic diode layer EL arranged in the transmissive area TA may be an OLED that includes an organic light emitting layer. At this time, the organic diode layer EL may include a deposited structure of a charge generating layer and a plurality of organic light emitting layers. Since the pixel electrodes are not arranged in the transmissive area TA, a current is not applied to the organic diode layer EL of the transmissive area TA, whereby the organic diode layer EL of the transmissive area TA does not emit light.

The organic diode layer EL is also in the light emissive area EA as well as the transmissive area TA, and includes a deposited structure of a charge generating layer and a plurality of organic light emitting layers. The organic diode layer EL of the light emissive area EA emits white light.

One of the plurality of subpixels SP arranged in the light emissive area EA emits at least one of red light, green light, blue light and white light. The light emissive area EA may include four subpixels SP in the form of quad. One subpixel SP includes the driving transistor D-TR, the first sub emissive part SEA1 and the second sub emissive part SEA2 arranged over the substrate 111. The first sub emissive part SEA1 and the second sub emissive part SEA2 emit the same colored light. At this time, even though the organic diode layer EL emits white light, the subpixel SP emits at least one of red light, green light, blue light and white light through a color filter which will be described later.

The display device further includes a data line arranged to overlap with at least a portion of the subpixel from the first subpixel electrode SPE1 to the second subpixel electrode SPE2, a scan line SL arranged between adjacent subpixels SP in a direction different from the data line DL, and a repair line RL arranged between at least a portion of the subpixel and at least a portion of one transmissive area TA.

A first end of the repair line RL may be overlapped with at least a portion of the first subpixel electrode SPE1 of at least one subpixel SP and a second end of the repair line RL may be extended to its adjacent subpixel SP and overlapped with at least a portion of the first subpixel electrode SPE1 of the adjacent subpixel SP, whereby the repair line RL may electrically be floated with the first subpixel electrode SPE1 of the adjacent subpixel SP.

The first end of the repair line RL may be overlapped with at least a portion of the first subpixel electrode SPE1 of at least one subpixel SP and the second end of the repair line RL may be extended to its adjacent subpixel SP and electrically connected with at least a portion of the first subpixel electrode SPE1 of the adjacent subpixel SP.

The first end of the repair line RL may be overlapped with at least a portion of the first subpixel electrode SPE1 of at least one subpixel SP and the second end of the repair line RL may be extended to its adjacent subpixel SP and therefore overlapped with and electrically connected with at least a portion of the first subpixel electrode SPE1 of the adjacent subpixel SP.

The driving transistor D-TR may be arranged to correspond to each of the plurality of subpixels SP. The driving transistor D-TR may be arranged over the buffer layer 220 of the substrate 111, and may include an active layer 22, a gate electrode 28, a source electrode 24, and a drain electrode 26.

The active layer 22 of the driving transistor D-TR may be arranged over the buffer layer 220, and may be overlapped with the gate electrode 28, the source electrode 24 and the drain electrode 26. The active layer 22 may directly be in contact with the source electrode 24 and the drain electrode 26 and face the gate electrode 28 by interposing the gate insulating film 230. The active layer 22 may be an oxide based conductorized semiconductor.

A light shielding layer 11 may be arranged below the driving transistor D-TR. At this time, the buffer layer 220 is arranged between the light shielding layer 11 and the active layer 22. In order to insulate the active layer 22 constituting the driving transistor D-TR from the gate electrode 28, the gate insulating film 230 is interposed between the active layer 22 and the gate electrode 28. In order to insulate the gate electrode 28 from the source and drain electrodes 24 and 26, the first insulating layer 240 is interposed between the gate electrode 28 and the source and drain electrodes 24 and 26.

Capacitors C1 and C2 may be arranged at one side of the driving transistor D-TR, and the first electrode of the capacitor C1 may be formed as the source electrode 24 of the driving transistor D-TR is extended. At this time, the light shielding layer 11 is extended to a position where the capacitors C1 and C2 are arranged below the driving transistor D-TR, whereby the light shielding layer 11 is arranged below the first electrode of the capacitor C1.

The capacitors C1 and C2 form capacitance between the electrode of the capacitor C2 and the light shielding layer 11 and also form capacitance between the electrode of the capacitor C2 and the electrode of the capacitor C1, whereby overall capacitance may be increased.

An overcoat layer 260 is arranged over the second insulating film 250 to compensate for a step difference of several deposited layers including the driving transistor D-TR and the second insulating film 250 for protecting the source electrode 24 and the drain electrode 26 of the driving transistor D-TR.

At least one of the first insulating film 240 and the second insulating film 250 may include any one of a silicon nitride film (SiNx), a silicon oxide film (SiOx) and SiON, or may include a deposited structure of SiNx, SiOx and SiON. The first insulating film 240 and the second insulating film 250 may be made of the same material.

The pixel electrodes are arranged over the overcoat layer 260 in the light emissive area EA. The overcoat layer 260 is arranged in the light emissive area EA, and is not arranged in the transmissive area TA. The overcoat layer 260 may not be arranged even in the area where the connection electrode structure CES between the transmissive area TA and the light emissive area EA is arranged. The overcoat layer 260 may include resin such as photo acryl and polyimide.

One subpixel SP includes the first subpixel emissive part SEA1 and the second subpixel emissive part SEA2, and each of the pixel electrodes of the light emissive area EA is arranged to correspond to the first sub emissive part SEA1 and the second sub emissive part SEA2. The number of sub emissive parts may be defined as the number of subpixel electrodes constituting the pixel electrodes. The first sub emissive part SEA1 and the second sub emissive part SEA2 constituting one subpixel SP emit the same colored light.

In the light emissive area EA, the pixel electrodes are in contact with the source electrode 24 of the driving transistor D-TR through a contact hole of the overcoat layer 260 and the second insulating film 250. The first subpixel electrode SPE1 and the second subpixel electrode SPE2 are surrounded by a bank 280 to define the first sub emissive part SEA1 and the second sub emissive part SEA2.

The connection electrode structure CES electrically connecting the first and second subpixel electrodes SPE1 and SPE2 constituting one subpixel SP with each other is arranged between the transmissive area TA and the light emissive area EA. The connection electrode structure CES may be arranged to protrude from the subpixel SP to the transmissive area TA. The transmissive area TA may be a diagonal shape corresponding to the connection electrode structure CES arranged to be protruded.

The connection electrode structure CES includes the first to fourth connection electrodes CE1, CE2, CE3 and CE4, the first to third connection electrodes CE1, CE2 and CE3 are arranged over the second insulating film 250, and the fourth connection electrode CE4 is arranged over the buffer layer 220. At this time, the first to third connection electrodes CE1, CE2 and CE3 are in contact with the fourth connection electrode CE4 through a contact hole of the first insulating film 240 and a contact hole of the second insulating film 250.

The pixel electrodes and the first to third connection electrodes CE1, CE2 and CE3 constituting the connection electrode structure CES may be made of the same material, and may include at least one of ITO, MoTi, Al, Ag, Mo, Ti and Cu, or may be provided with a deposited structure of at least one of ITO, MoTi, Al, Ag, Mo, Ti and Cu. The pixel electrodes and the first to third connection electrodes CE1, CE2 and CE3 may include a deposited structure of ITO/MoTi/Cu/ITO. Since the first to third connection electrodes CE1, CE2 and CE3 are formed by the same process as that of the pixel electrodes, a separate additional process may be omitted, whereby productivity is improved.

If the pixel electrodes include MoTi or Mo, these electrodes may serve as reflective panels, whereby the cavity effect of the OLED may be enhanced. The display device according to the present disclosure corresponds to a top emissive mode, and the pixel electrodes include at least one conductor of MoTi, Al, Ag, Mo, Ti and Cu, which serves as a reflective panel, wherein the conductor serving as a reflective panel improves light emissive efficiency.

At least one of the pixel electrodes and the first to third connection electrodes CE1, CE2 and CE3 may have a thickness of 3000 Å to 6000 Å.

The fourth connection electrode CE4 is made of an oxide semiconductor which is the same material as that of the active layer of the driving transistor D-TR, and is arranged in the same layer as the active layer 22 of the driving transistor D-TR. The fourth connection electrode CE4 may have a thickness of 500 Å or less.

If the fourth connection electrode CE4 is made of the same material as that of the other electrodes CE1, CE2 and CE3 or made of metal, energy is increased when laser cutting is performed, and the laser is reflected by metal to lower an absorption rate, whereby a power consumed for cutting is increased and therefore damage of the device may be increased. However, if the fourth connection electrode CE4 subjected to laser cutting is made of an oxide semiconductor layer, an absorption rate is high even at a low wavelength range to easily enable cutting of the fourth connection electrode CE4. Also, a wavelength band for cutting the fourth connection electrode CE4 made of an oxide semiconductor layer does not react with adjacent metals, whereby the fourth connection electrode CE4 may only be cut, and damage of the organic diode layer EL constituting the OLED or TFT device such as the driving transistor D-TR is not caused. If the fourth connection electrode CE4 has a thickness of 3000 Å to 6000 Å like the first to third connection electrodes CE1, CE2 and CE3, energy is increased when laser cutting is performed, whereby adjacent layers may be damaged. However, since the fourth connection electrode CE4 has a thickness of 500 Å or less, energy is less consumed during laser cutting, whereby damage that may be given to adjacent layers may be minimized. Particularly, since the fourth connection electrode CE4 is arranged by the same process as that of the active layer 22 of the driving transistor D-TR, an additional process is not required, whereby productivity may be prevented from being reduced.

The fourth connection electrode CE4 of the connection electrode structure CES arranged between the light emissive area EA and the transmissive area TA of the subpixel SP adjacent to one subpixel SP is cut and arranged to be disconnected. Even though the fourth connection electrode CE4 is arranged to be partially disconnected, at least one of the first subpixel electrode SPE1 corresponding to the first sub emissive part SEA1 of the adjacent subpixel SP and the second subpixel electrode SPE2 corresponding to the second sub emissive part SEA2 is electrically connected to the driving transistor D-TR, whereby the adjacent subpixel SP may be driven.

Consequently, since two sub emissive parts SEA1 and SEA2 are provided in one subpixel SP, even though a dark spot or a bright spot occurs in one subpixel SP, light is emitted through the other one sub emissive part, whereby one subpixel SP may be driven normally.

Since the display device according to the present disclosure includes the connection electrode structure CES, even though a bright spot or a dark spot occurs, the display device may drive the subpixel SP without restriction in occurrence of theses bright spot or dark spot.

The bank 280 is not arranged in the transmissive area TA but arranged in the light emissive area EA to improve the transmittance of the transmissive area TA, and is arranged at edges of the pixel electrodes such that the pixel electrodes are exposed. The bank 280 is arranged in the area where the connection electrode structure CES between the transmissive area TA and the light emissive area EA is arranged. The bank 280 may overlay the entire surface of the fourth connection electrode CE4, and may partially overlay the first connection electrode CE1, the second connection electrode CE2 and the third connection electrode CE3. At this time, the bank 280 is arranged to overlay the area where the first connection electrode CE1 is in contact with the fourth connection electrode CE4, the area where the second connection electrode CE2 is in contact with the fourth connection electrode CE4, and the area where the third connection electrode CE3 is in contact with the fourth connection electrode CE4.

The organic diode layer EL is arranged over the bank 280 for defining the pixel electrodes of the adjacent subpixel SP as well as one subpixel SP, which includes the first subpixel electrode SPE1 and the second subpixel electrode SPE2 of the light emissive area EA.

The organic diode layer EL may be arranged in both the transmissive area TA and the light emissive area EA. The organic diode layer EL includes a deposited structure of a hole injecting layer, a hole transporting layer, a charge generating layer, an electron transporting layer, an electron injecting layer, and a plurality of organic light emitting layers, and emits white light through an anode electrode 270 and a cathode electrode 290 embodied by the pixel electrodes. Since white light of the organic diode layer EL is converted to red light, green light, blue light and white light through a color filter 320 over the organic diode layer EL, one subpixel SP emits at least one of red light, green light, blue light and white light.

In another aspect, although organic common layers such as the hole injecting layer, the hole transporting layer, the charge generating layer, the electron transporting layer and the electron injecting layer may be arranged in both the transmissive area TA and the light emissive area EA, the organic light emitting layer may be arranged only in the light emissive area EA.

Since the cathode electrode 290 is fully arranged over the organic diode layer EL, the cathode electrode 290 is arranged in both the transmissive area TA and the light emissive area EA. The cathode electrode 290 may be made of a transparent or semi-transparent conductor. The cathode electrode 290 may be formed of a transparent conductive oxide (TCO) such as Indium Tin Oxide (ITO) and Indium Zinc Oxide (IZO). The cathode electrode 290 may include Mg and Ag, which are general metal electrodes, and at this time, transmittance may be improved by controlling a ratio of Mg and Ag, whereby a transparent conductor may be embodied.

The encapsulation layer 310 may overlay both the transmissive area and the light emissive area EA. According to one example, the encapsulation layer 310 may fully be provided over the cathode electrode 290. The encapsulation layer 310 may serve to prevent external water from being permeated into the organic diode layer EL, thereby preventing the organic diode layer EL from being degraded. The encapsulation layer 310 may be provided by the combination of at least one inorganic film and at least one organic film.

The display device according to the present disclosure may further include a color filter 310 over the encapsulation layer 310. The color filter 320 is arranged to correspond to the light emissive area EA, and is not arranged in the transmissive area TA. The color filter 320 is arranged over the encapsulation layer 310 to overlap at least one subpixel SP. The color filter 320 includes R, G and B color filters 320 to correspond to predetermined colored light that should be emitted by the subpixel SP.

The color filter 320 may prevent light from being reflected by a metal material arranged over the substrate 111, and may improve emissive efficiency of the light emissive area EA by preventing light leakage of the light emissive area EA from occurring. Although not shown, a black matrix may further be arranged between the color filters 320. The black matrix may prevent reflection of lines therebelow or light leakage from occurring. Also, an overcoat layer may further be arranged between the encapsulation layer 310 and the color filter 320.

The display device according to one aspect of the present disclosure comprises a pixel electrode including a first subpixel electrode and a second subpixel electrode arranged to be spaced apart from each other within at least one subpixel of a plurality of subpixels over a substrate, a driving transistor driving the at least one subpixel, and a connection electrode structure electrically connecting at least one of the first subpixel electrode and the second subpixel electrode of the pixel electrode with the driving transistor.

The display device according to another aspect of the present disclosure comprises a transmissive area transmitting external light of a substrate, a first subpixel electrode arranged in at least one subpixel of a plurality of subpixels arranged adjacent to the transmissive area, a second subpixel electrode arranged to be spaced apart from the first subpixel electrode within the at least one subpixel, a driving transistor driving the at least one subpixel, and a connection electrode structure electrically connecting at least one of the first subpixel electrode and the second subpixel electrode with the driving transistor.

The connection electrode structure may include a first connection electrode extended from the first end of the first subpixel electrode to a first direction, wherein the first direction is a direction which is perpendicular to a direction from the first subpixel electrode to the second subpixel electrode, a second connection electrode extended from the first end of the second subpixel electrode to the first direction, a third connection electrode electrically connected to the driving transistor and extended to the first direction, and a fourth connection electrode having the first end contacted with the first connection electrode and the second end contacted with the second connection electrode, contacted with the third connection electrode between the first end and the second end, and arranged in and contacted with a layer different from at least one of the first to third connection electrodes.

The connection electrode structure may include a first connection electrode extended from the first end of the first subpixel electrode to a first direction, wherein the first direction is a direction which is perpendicular to a direction from the first subpixel electrode to the second subpixel electrode, a second connection electrode extended from the first end of the second subpixel electrode to the first direction, a third connection electrode arranged between the first subpixel electrode and the second subpixel electrode and extended to the first direction, and a fourth connection electrode of which the first end or the second end is electrically connected with at least one of the first subpixel electrode and the second subpixel electrode. The first connection electrode is made of the same material as that of the first subpixel electrode or arranged over the same layer as the first subpixel electrode, the second connection electrode is made of the same material as that of the second subpixel electrode or arranged over the same layer as the second subpixel electrode, and the fourth connection electrode is made of a material different from that of the first connection electrode and the second connection electrode or arranged over a layer different from the first connection electrode and the second connection electrode, or the fourth connection electrode includes the same material as that of an active layer constituting the driving transistor or is arranged over the same layer as the active layer.

At least one of the first subpixel electrode and the second subpixel electrode may partially be arranged over the driving transistor, and the fourth connection electrode may be arranged over the same layer as an active layer constituting the driving transistor.

The fourth connection electrode may be arranged in a second direction different from or orthogonal to the first direction, and may connect the first connection electrode with the third connection electrode through a bridge or connect the second electrode with the third connection electrode through a bridge.

The display device may further comprise: a buffer layer over the substrate, the fourth connection electrode being over the buffer layer, a first insulating film over the active layer, and a second insulating film over the first insulating film, wherein at least one of the second connection electrode and the third connection electrode is connected with the fourth connection electrode through a contact hole of the first insulating film and the second insulating film.

The first end of the third connection electrode may be contacted with a conductive layer extended from source electrode or drain electrode of the driving transistor and constituting one electrode of a capacitor in the at least one subpixel.

The third connection electrode connected with the driving transistor may be arranged between the first subpixel electrode and the second subpixel electrode.

The third connection electrode may be made of the same material as a material constituting at least one of the first subpixel electrode, the second subpixel electrode, the first connection electrode and the second connection electrode, or may be arranged over the same layer as at least one of the first subpixel electrode, the second subpixel electrode, the first connection electrode and the second connection electrode.

The fourth connection electrode may electrically connect the first connection electrode, the second connection electrode and the third connection electrode with one another.

The at least one subpixel may further include a data line arranged to overlap with at least a portion of the at least one subpixel in a direction from the first subpixel electrode to the second subpixel electrode, and a repair line arranged at one side of the at least one subpixel in a direction parallel with the data line, wherein at least a portion of the repair line is arranged to overlap with or cross the connection electrode structure, and the repair line may be extended in a direction of an adjacent subpixel adjacent to the subpixel in a direction of the data line.

At least one of the first subpixel electrode, the second subpixel electrode, the first connection electrode, the second connection electrode and the third connection electrode may include at least one of ITO, MoTi, Al, Ag, Mo, Ti and Cu or may be provided with a deposited structure of at least one of ITO, MoTi, Al, Ag, Mo, Ti and Cu.

At least one of the first subpixel electrode, the second subpixel electrode, the first connection electrode, the second connection electrode and the third connection electrode may include a four layered structure of ITO/MoTi/Cu/ITO.

At least one of the first subpixel electrode, the second subpixel electrode, the first connection electrode, the second connection electrode and the third connection electrode may have a thickness of 3000 Å to 6000 Å.

The fourth connection electrode may be an oxide semiconductor layer, and the fourth connection electrode may include the same material as that of the active layer of the driving transistor and its thickness may be 500 Å or less.

The fourth connection electrode may include the same material as that of an oxide semiconductor layer constituting the driving transistor.

The fourth connection electrode is connected with the third connection electrode between a first end of the first connection electrode and a first end of the second connection electrode, and the third connection electrode is connected with a first electrode of a capacitor arranged in the at least one subpixel.

The fourth connection electrode may be disconnected between the first connection electrode and the third connection electrode or between the second connection electrode and the third connection electrode, or may electrically be connected with the first connection electrode, the second connection electrode and the third connection electrode.

The display device may further comprise a data line arranged to overlap with at least a portion of the at least one subpixel in a direction from the first subpixel electrode to the second subpixel electrode, a scan line arranged between the at least one subpixel and the at least one subpixel's adjacent subpixel in a direction different from the data line, and a repair line arranged between at least a portion of the at least one subpixel and at least a portion of the transmissive area.

The first end of the repair line may be overlapped with at least a portion of the first subpixel electrode of the at least one subpixel and the second end of the repair line may be extended to the adjacent subpixel and electrically floated with the first subpixel electrode of the adjacent subpixel while being overlapped with at least a portion of the first subpixel electrode of the adjacent subpixel, or the first end of the repair line may be overlapped with at least a portion of the first subpixel electrode of the at least one subpixel and the second end of the repair line may be extended to the adjacent subpixel and electrically connected with at least a portion of the first subpixel electrode of the adjacent subpixel, or the first end of the repair line may be overlapped with at least a portion of the first subpixel electrode of the at least one subpixel and the second end of the repair line may be extended to the adjacent subpixel and overlapped with and electrically connected with at least a portion of the first subpixel electrode of the adjacent subpixel.

The display device may further comprise an organic diode layer arranged over the first subpixel electrode and the second subpixel electrode, a cathode electrode arranged over the organic diode layer, and an encapsulation layer arranged over the cathode electrode, wherein the plurality of subpixels may be provided with four subpixels in quad arrangement, and the at least one subpixel emits at least one of red light, green light, blue light and white light and the emitted light is headed from the cathode to the encapsulation layer.

The display device may further comprise a color filter arranged over the encapsulation layer to overlap the at least one subpixel.

The display device according to another aspect of the present disclosure may further comprise a first sub emissive part corresponding to the first subpixel electrode, and a second sub emissive part arranged to be spaced apart from the first sub emissive part, corresponding to the second subpixel electrode, wherein the first connection electrode is arranged between the first sub emissive part and the transmissive area, the second connection electrode is arranged between the second sub emissive part and the transmissive area, and the fourth connection electrode is arranged between the first and second sub emissive parts and the transmissive area.

The first sub emissive part and the second sub emissive part emit the same light.

The display device according to another aspect of the present disclosure comprises a pixel electrode including a first subpixel electrode and a second subpixel electrode arranged to be spaced apart from each other in at least one subpixel of a plurality of subpixels over a substrate, a driving transistor driving the one subpixel, and a connection electrode structure electrically connecting at least one of the first subpixel electrode and the second subpixel electrode of the pixel electrode with the driving transistor, wherein a repair line is arranged between adjacent subpixels of the plurality of subpixels in a direction crossing the at least one subpixel, and the repair line is partially overlapped with the pixel electrode.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various aspects described above can be combined to provide further aspects. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the aspects can be modified, if necessary to employ concepts of the various patents, applications and publications to provide yet further aspects.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A display device comprising:
a pixel electrode including a first subpixel electrode and a second subpixel electrode that are spaced apart from each other within at least one subpixel of a plurality of subpixels over a substrate;
a driving transistor driving the at least one subpixel; and
a connection electrode structure electrically connecting at least one of the first subpixel electrode and the second subpixel electrode of the pixel electrode with the driving transistor,
wherein the at least one subpixel further includes:
a data line arranged to overlap with at least a portion of the at least one subpixel in a direction from the first subpixel electrode to the second subpixel electrode; and
a repair line arranged at one side of the at least one subpixel in a direction parallel with the data line,
at least a portion of the repair line is arranged to overlap with at least a portion of the connection electrode structure or cross the connection electrode structure,
wherein the repair line is extended in a direction of an adjacent subpixel adjacent to the at least one subpixel in a direction of the data line.

2. The display device of claim 1, wherein the connection electrode structure includes:
a first connection electrode extended from a first end of the first subpixel electrode to a first direction which is perpendicular to a direction from the first subpixel electrode to the second subpixel electrode;
a second connection electrode extended from a first end of the second subpixel electrode to the first direction;
a third connection electrode electrically connected to the driving transistor and extended to the first direction; and
a fourth connection electrode having a first end contacted with the first connection electrode and a second end contacted with the second connection electrode, contacted with the third connection electrode between the first end and the second end, and arranged in and contacted with a layer different from at least one of the first connection electrode, the second connection electrode and the third connection electrodes.

3. The display device of claim 2, wherein at least one of the first subpixel electrode and the second subpixel electrode is partially arranged over the driving transistor, and the fourth connection electrode is arranged over a same layer as an active layer constituting the driving transistor.

4. The display device of claim 3, further comprising:
a buffer layer over the substrate;
a first insulating film over the active layer or the fourth connection electrode over the buffer layer; and
a second insulating film over the first insulating film,
wherein at least one of the second connection electrode and the third connection electrode is connected with the fourth connection electrode through a contact hole of the first insulating film and the second insulating film, wherein a first end of the third connection electrode is contacted with a conductive layer extended from source electrode or drain electrode of the driving transistor, constituting one electrode of a capacitor in the at least one subpixel, and wherein the third connection electrode connected with the driving transistor is arranged between the first subpixel electrode and the second subpixel electrode.

5. The display device of claim 4, wherein the third connection electrode is made of a same material as a material constituting at least one of the first subpixel electrode, the second subpixel electrode, the first connection electrode and the second connection electrode.

6. The display device of claim 4, wherein the third connection electrode is arranged over a same layer as at least one of the first subpixel electrode, the second subpixel electrode, the first connection electrode and the second connection electrode.

7. The display device of claim 2, wherein the fourth connection electrode is arranged in a second direction different from or orthogonal to the first direction, and connects the first connection electrode with the third connection electrode through a bridge or connects the second electrode with the third connection electrode through a bridge.

8. The display device of claim 7, wherein the fourth connection electrode includes an oxide semiconductor layer.

9. The display device of claim 7, wherein the fourth connection electrode includes a same material as that of the active layer of the driving transistor and has a thickness of 500 Å or less.

10. The display device of claim 2, wherein at least one of the first subpixel electrode, the second subpixel electrode, the first connection electrode, the second connection electrode and the third connection electrode includes at least one of ITO, MoTi, Al, Ag, Mo, Ti and Cu or is provided with a deposited structure of the at least one of ITO, MoTi, Al, Ag, Mo, Ti and Cu, or at least one of the first subpixel electrode, the second subpixel electrode, the first connection electrode, the second connection electrode and the third connection electrode includes a four layered structure of ITO/MoTi/Cu/ITO.

11. The display device of claim 2, wherein at least one of the first subpixel electrode, the second subpixel electrode, the first connection electrode, the second connection electrode and the third connection electrode has a thickness of 3000 Å to 6000 Å.

12. A display device comprising:
a transmissive area transmitting external light of a substrate;
a first subpixel electrode arranged in at least one subpixel of a plurality of subpixels arranged adjacent to the transmissive area;
a second subpixel electrode spaced apart from the first subpixel electrode within the at least one subpixel;
a driving transistor driving the at least one subpixel; and
a connection electrode structure electrically connecting at least one of the first subpixel electrode and the second subpixel electrode with the driving transistor,
wherein the at least one subpixel further includes:
a data line arranged to overlap with at least a portion of the at least one subpixel in a direction from the first subpixel electrode to the second subpixel electrode; and
a repair line arranged at one side of the at least one subpixel in a direction parallel with the data line, at least a portion of the repair line is arranged to overlap with at least a portion of the connection electrode structure or cross the connection electrode structure, wherein the repair line is extended in a direction of an adjacent subpixel adjacent to the at least one subpixel in a direction of the data line.

13. The display device of claim 12, wherein the connection electrode structure includes:
a first connection electrode extended from a first end of the first subpixel electrode to a first direction, wherein the first direction is a direction which is perpendicular to a direction from the first subpixel electrode to the second subpixel electrode;
a second connection electrode extended from a first end of the second subpixel electrode to the first direction;
a third connection electrode arranged between the first subpixel electrode and the second subpixel electrode and extended to the first direction; and
a fourth connection electrode of a first end or a second end is electrically connected with at least one of the first subpixel electrode and the second subpixel electrode,
wherein the first connection electrode is made of the same material as that of the first subpixel electrode or arranged over the same layer as the first subpixel electrode, the second connection electrode is made of a same material as that of the second subpixel electrode or arranged over a same layer as the second subpixel electrode, and the fourth connection electrode is made of a material different from that of the first connection electrode and the second connection electrode or arranged over a layer different from the first connection electrode and the second connection electrode, or the fourth connection electrode includes a same material as that of an active layer constituting the driving transistor or is arranged over a same layer as the active layer.

14. The display device of claim 13, wherein the fourth connection electrode includes the same material as that of an oxide semiconductor layer constituting the driving transistor, or is arranged over the same layer as the oxide semiconductor layer and its thickness is 500 Å or less, and the fourth connection electrode is connected with the third connection electrode between a first end of the first connection electrode and a first end of the second connection electrode, and the third connection electrode is connected with a first electrode of a capacitor arranged in the at least one subpixel.

15. The display device of claim 13, wherein the fourth connection electrode is disconnected between the first connection electrode and the third connection electrode or between the second connection electrode and the third connection electrode, or is electrically connected with the first connection electrode, the second connection electrode and the third connection electrode.

16. The display device of claim 13, further comprising:
a first sub emissive part corresponding to the first subpixel electrode; and
a second sub emissive part arranged to be spaced apart from the first sub emissive part, corresponding to the second subpixel electrode,
wherein the first connection electrode is arranged between the first sub emissive part and the transmissive area, the second connection electrode is arranged between the second sub emissive part and the transmissive area, and the fourth connection electrode is arranged between the first and second sub emissive parts and the transmissive area, and wherein the first sub emissive part and the second sub emissive part emit the same color of light.

17. The display device of claim 12, further comprising:
a scan line arranged between the at least one subpixel and the at least one subpixel's adjacent subpixel in a direction different from the data line,
wherein the repair line is arranged between at least a portion of the at least one subpixel and at least a portion of the transmissive area,
a first end of the repair line overlaps with at least a portion of the first subpixel electrode of the at least one subpixel and a second end of the repair line is extended to the adjacent subpixel and electrically floated with the first subpixel electrode of the adjacent subpixel while being overlapped with at least a portion of the first subpixel electrode of the adjacent subpixel, or
the first end of the repair line overlaps with at least a portion of the first subpixel electrode of the at least one subpixel and the second end of the repair line is extended to the adjacent subpixel and electrically connected with at least a portion of the first subpixel electrode of the adjacent subpixel, or
the first end of the repair line overlaps with at least a portion of the first subpixel electrode of the at least one subpixel and the second end of the repair line is extended to the adjacent subpixel and overlapped with and electrically connected with at least a portion of the first subpixel electrode of the adjacent subpixel.

18. The display device of claim 12, further comprising:
an organic diode layer arranged over the first subpixel electrode and the second subpixel electrode;
a cathode electrode arranged over the organic diode layer;
an encapsulation layer arranged over the cathode electrode; and
a color filter arranged over the encapsulation layer to overlap the at least one subpixel,
wherein the plurality of subpixels are provided with four subpixels in quad arrangement, and the at least one subpixel emits at least one of red light, green light, blue light and white light, the emitted light being headed from the cathode electrode to the encapsulation layer.

19. A display device comprising:
a pixel electrode including a first subpixel electrode and a second subpixel electrode arranged to be spaced apart from each other within at least one subpixel of a plurality of subpixels over a substrate;
a driving transistor driving the at least one subpixel; and
a connection electrode structure electrically connecting at least one of the first subpixel electrode and the second subpixel electrode with the driving transistor,
wherein a repair line is arranged between adjacent subpixels of the plurality of subpixels in a direction crossing the at least one subpixel, and the repair line partially overlaps with the pixel electrode,
wherein the at least one subpixel further includes:
a data line arranged to overlap with at least a portion of the at least one subpixel in a direction from the first subpixel electrode to the second subpixel electrode; and
the repair line arranged at one side of the at least one subpixel in a direction parallel with the data line,
at least a portion of the repair line is arranged to overlap with at least a portion of the connection electrode structure or cross the connection electrode structure,
wherein the repair line is extended in a direction of an adjacent subpixel adjacent to the at least one subpixel in a direction of the data line.

* * * * *